United States Patent
Nakazawa et al.

(10) Patent No.: US 12,342,557 B2
(45) Date of Patent: Jun. 24, 2025

(54) SEMICONDUCTOR DEVICE AND METHOD OF MANUFACTURING THE SAME

(71) Applicant: RENESAS ELECTRONICS CORPORATION, Tokyo (JP)

(72) Inventors: Yoshito Nakazawa, Tokyo (JP); Tomohiro Imai, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 372 days.

(21) Appl. No.: 17/405,733

(22) Filed: Aug. 18, 2021

(65) Prior Publication Data
US 2022/0102538 A1 Mar. 31, 2022

(30) Foreign Application Priority Data
Sep. 3, 2020 (JP) .................................. 2020-148585

(51) Int. Cl.
*H10D 12/00* (2025.01)
*H10D 12/01* (2025.01)

(52) U.S. Cl.
CPC ......... *H10D 12/481* (2025.01); *H10D 12/038* (2025.01)

(58) Field of Classification Search
CPC ...... H10D 12/00; H10D 12/01; H10D 12/038; H10D 12/481; H10D 62/10; H10D 62/13; H10D 62/60; H10D 62/102; H10D 62/127; H10D 62/142; H10D 62/106; H10D 62/112; H10D 62/124; H10D 64/00; H10D 64/117; H01L 21/78; H01L 21/266; H01L 29/7395; H01L 29/7396; H01L 29/7397; H01L 29/0638; H01L 29/407; H01L 29/0603;
(Continued)

(56) References Cited

U.S. PATENT DOCUMENTS

| 9,842,919 B2 | 12/2017 | Matsuura | |
|---|---|---|---|
| 2015/0236142 A1* | 8/2015 | Laven | H01L 21/02639 257/66 |

(Continued)

FOREIGN PATENT DOCUMENTS

| JP | 2009-130096 A | 6/2009 |
|---|---|---|
| JP | 2009-176772 A | 8/2009 |

(Continued)

OTHER PUBLICATIONS

Notice of Reasons for Refusal dated Nov. 28, 2023 issued in the corresponding Japanese Patent Application No. 2022-148585, with English translation.

*Primary Examiner* — Chuong A Luu
(74) *Attorney, Agent, or Firm* — Rimon P.C.

(57) ABSTRACT

A semiconductor device according to one embodiment includes an IGBT having a p-type collector layer and an n-type field stop layer on a back surface of a silicon substrate. The n-type field stop layer is selectively provided on an upper side of the p-type collector layer such that a first end portion of the n-type field stop layer is separated from a first side surface of the silicon substrate by a predetermined distance, and an n-type drift layer is provided between the first side surface of the silicon substrate and the first end portion of the n-type field stop layer. An impurity concentration of the n-type drift layer is lower than an impurity concentration of the n-type field stop layer.

7 Claims, 26 Drawing Sheets

(58) Field of Classification Search
CPC ........... H01L 29/0619; H01L 29/66348; H01L 29/0684; H01L 29/66333; H01L 29/30; H01L 29/34; H01L 29/402; H01L 29/1095
USPC ........................................................ 257/139
See application file for complete search history.

(56) References Cited

U.S. PATENT DOCUMENTS

| | | | | |
|---|---|---|---|---|
| 2016/0336393 | A1* | 11/2016 | Kim | H01L 23/528 |
| 2017/0054010 | A1* | 2/2017 | Matsuura | H01L 29/1095 |
| 2019/0088736 | A1* | 3/2019 | Yamaguchi | H01L 29/7395 |
| 2019/0103479 | A1* | 4/2019 | Suzuki | H01L 29/66333 |
| 2020/0212209 | A1* | 7/2020 | Nagata | H01L 29/1095 |

FOREIGN PATENT DOCUMENTS

| | | |
|---|---|---|
| JP | 2017-157733 A | 9/2017 |
| JP | 2019-071387 A | 5/2019 |

* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2020-148585 filed on Sep. 3, 2020 including the specification, drawings and abstract is incorporated herein by reference in its entirety.

BACKGROUND

This disclosure relates to a semiconductor device and a method of manufacturing the same and particularly to a technology effectively applied to a semiconductor device having an IE (Injection Enhanced) IGBT (Insulated Gate Bipolar Transistor) and a method of manufacturing the same.

As an example of a structure of an IE-IGBT, a structure including stripe-shaped trench gates formed so as to surround an n-type emitter layer and a p-type base layer in a plan view, a p-type floating layer arranged outside the trench gate and formed so as to have one end in contact with a side surface of the trench gate, and an n-type hole barrier layer formed below the p-type base layer is known (see, for example, Patent Document 1).

In addition, Patent Document 1 discloses a structure including stripe-shaped trench emitters formed so as to be in contact with the other end of the p-type floating layer in order to provide a path for discharging holes accumulated in the p-type floating layer for the purpose of suppressing the switching loss of the IGBT. Further, Patent Document 1 discloses a structure including an n-type field stop layer and a p-type collector layer on a lower surface of an n-type drift layer arranged below the p-type base layer.

There are Disclosed Techniques Listed Below

[Patent Document 1] Japanese Unexamined Patent Application Publication No. 2017-157733

SUMMARY

The inventors have found that there are following concerns regarding the n-type field stop layer and the p-type collector layer formed on a back surface side of the IGBT from the viewpoint of reducing the leakage current during reverse bias at the time of high-speed switching of the IGBT.

FIG. 1 is a schematic plan view of a semiconductor device having an IGBT. FIG. 2 is a cross-sectional view along a line A-A in FIG. 1. As shown in FIG. 1, a semiconductor device 100 including an IGBT is formed in a rectangular semiconductor chip CHIP (referred to also as a substrate SUB) made of n-type single crystal silicon in a plan view. The semiconductor chip CHIP has, on a main surface (front surface) side thereof, an IGBT cell formation region RCL, a cell peripheral connection region RP0, and a chip outer peripheral portion (referred to also as a chip outer peripheral region) PER. The cell formation region RCL is provided in a substantially central region of the semiconductor chip CHIP. The cell peripheral connection region RP0 is provided so as to surround the cell formation region RCL. The chip outer peripheral portion PER is provided in the chip outer peripheral region so as to surround the cell peripheral connection region RP0. An emitter electrode EE, an emitter pad EP, a gate electrode (CE) (not shown), and the like are provided on the upper side of the cell formation region RCL. In the cell peripheral connection region RP0, in this example, a gate pad GP, a gate electrode (GE) (not shown), and a built-in gate resistance (resistance element) Rg connected between the gate pad GP and the gate electrode (GE) are provided. The built-in gate resistance Rg is made of, for example, doped polycrystalline silicon (Doped Poly-Si).

As shown in FIG. 2, an n-type field stop layer FSL and a p-type collector layer CL of the IGBT are formed on a back surface BS of the substrate SUB. Although a collector electrode CE is entirely formed on a lower side of the p-type collector layer CL, the illustration thereof is omitted and a circle mark indicating it is shown in FIG. 2. Also, in FIG. 2, as to the cell formation region RCL, only three components of trench emitters TE, trench gates TG, and p-type floating layers FL formed in an n-type drift layer DL are shown in order to prevent the drawing from being complicated. Also, the emitter electrode EE is formed on an upper side of an interlayer insulating film IL. In the cell peripheral connection region RP0, an annular p-type well region P0 is provided in the n-type drift layer DL so as to surround the cell formation region RCL. Both ends of the p-type well region P0 are electrically connected to the emitter electrodes EE via emitter contacts EEC. In the chip outer peripheral region PER, a plurality of annular p-type floating field rings P1, P2, P3, P4, and P5 are provided in the n-type drift layer DL on the outer side of the annular p-type well region P0. The floating field rings P1, P2, P3, P4, and P5 are connected to field plates FP1, FP2, FP3, FP4, and FP5, respectively. An annular channel stopper PG is provided in the n-type drift layer DL on the outer side of the p-type floating field rings P1, P2, P3, P4, and P5. The channel stopper PG is connected to a guard ring GR. The channel stopper PG is an n-type layer and has a collector potential. A width of the chip outer peripheral region PER in a first direction X is about 400 to 600 μm, and an interval between the emitter contacts EEC at both ends of the p-type well region P0 in the first direction X is about 1 to 4 mm. As shown in FIG. 1, the built-in resistance Rg and the gate pad GP are provided on an upper side of the wide p-type well region P0 having a large width of 400 to 600 μm in the first direction X.

A semiconductor wafer on which a plurality of semiconductor devices 100 are formed is singulated by the dicing process, and the plurality of semiconductor devices 100 each having an IGBT are formed. Here, as shown in FIG. 2, a damage layer DML is formed in some cases on the back surface side of the side surface of the semiconductor chip CHIP (or the side surface of the substrate SUB) due to damage (chipping or the like) in the dicing process. The inventors have found that, when the damage layer DML reaches a PN junction portion composed of the n-type field stop layer FSL and the p-type collector layer CL, the PN junction is short-circuited, and a leakage path PTH is formed between the emitter electrode EE and the collector electrode CE as shown in FIG. 2. This leakage path PTH is formed as a path that passes through the emitter electrode EE, the p-type well region P0, the n-type drift layer DL, the n-type field stop layer FSL, the damage layer DML, and the collector electrode CE, and a parasitic diode Ds is formed by the p-type well region P0 and the n-type drift layer DL.

During the reverse bias in which the potential of the emitter electrode EE is higher than the potential of the collector electrode CE, the parasitic diode Ds in this leakage path PTH operates. The electron current at the time when the parasitic diode Ds operates passes through the damage layer DML and the n-type field stop layer FSL having a higher impurity concentration than the n-type drift layer DL, and flows to the side of the emitter electrode EE through the n-type drift layer DL below the p-type well region P0 at the shortest distance. This causes a reverse bias leakage defect between the collector and the emitter of the IGBT.

Further, the inventors have found that, when the IGBT is turned on to rapidly switch from the reverse bias state in which the parasitic diode Ds operates to the forward bias state in which the potential of the collector electrode CE is higher than the potential of the emitter electrode EE, an oxide film OXL located below the built-in gate resistance Rg is broken in some cases.

If the damage layer DML that reaches the PN junction portion can be completely eliminated in the dicing process in the manufacturing process of the IGBT, the operation of the parasitic diode Ds during the reverse bias can be suppressed. However, especially the IGBT that handles high voltage and large current has a large chip area (for example, 10 mm×10 mm or more) and a relatively long side to be diced as compared with a normal LSI chip, and it is thus practically very difficult to completely eliminate the damage layer DML.

An object of this disclosure is to provide a technology capable of supporting the high-speed switching by suppressing the occurrence of the leakage defect during the reverse bias in the semiconductor device having the IGBT.

Other objects and novel features will become apparent from the description of this specification and the accompanied drawings.

An outline of a typical embodiment in this disclosure will be briefly described as follows.

A semiconductor device according to one embodiment includes an IGBT having a p-type collector layer and an n-type field stop layer on a back surface of a silicon substrate. The n-type field stop layer is selectively provided on an upper side of the p-type collector layer such that a first end portion of the n-type field stop layer is separated from a first side surface of the silicon substrate by a predetermined distance, and an n-type drift layer is provided between the first side surface of the silicon substrate and the first end portion of the n-type field stop layer. An impurity concentration of the n-type drift layer is lower than an impurity concentration of the n-type field stop layer.

In the semiconductor device according to the embodiment described above, it is possible to provide a technology capable of supporting the high-speed switching by suppressing the occurrence of the leakage defect during the reverse bias in the semiconductor device having the IGBT.

DETAILED DESCRIPTION

Figure 1:
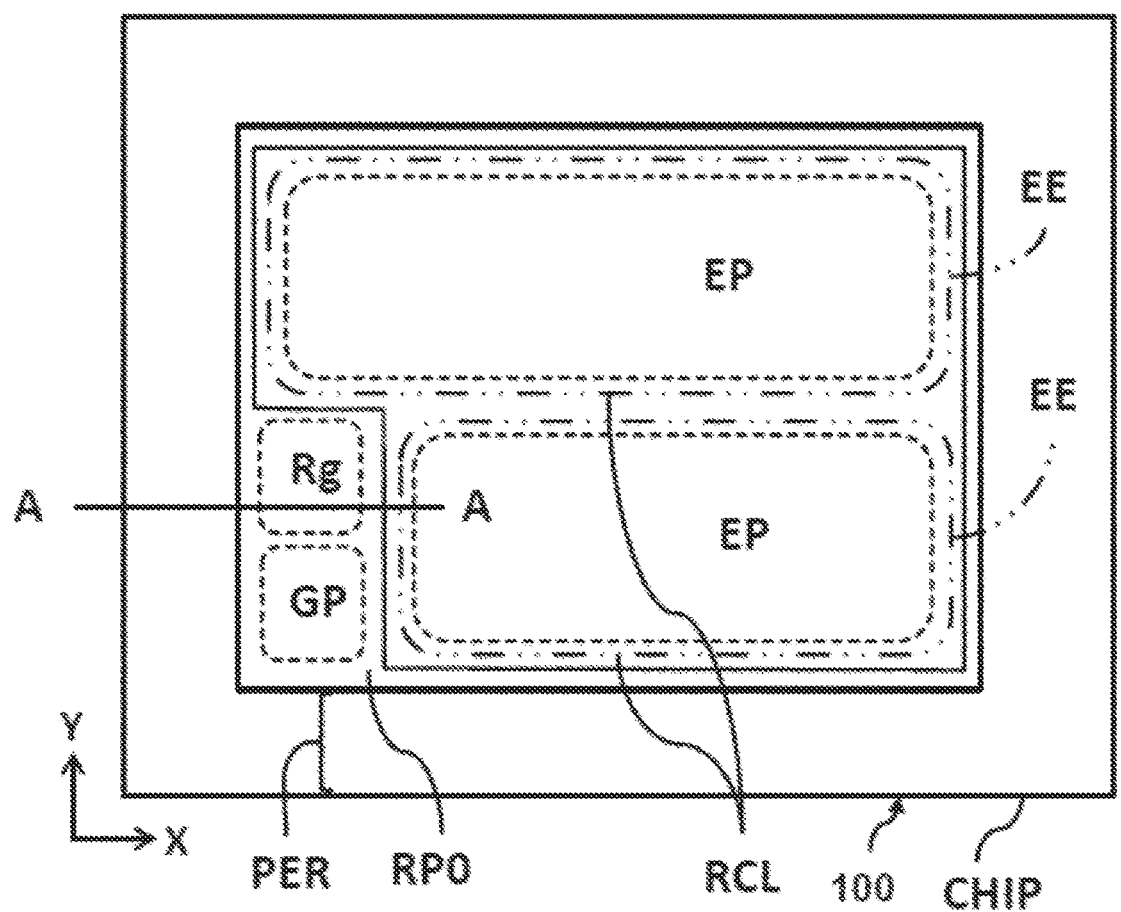
FIG. 1 is a schematic plan view of a semiconductor device having an IGBT.

Hereinafter, a semiconductor device according to one embodiment will be described in detail with reference to drawings. Note that, in the specification and the drawings, the same components or corresponding components are denoted by the same reference characters and the redundant descriptions are omitted. Also, the embodiment and each modification may be combined at least partially as appropriate. Although the drawings are shown schematically as compared with an actual case for making the description clearer in some cases, these are mere examples and do not limit the interpretation of the present invention.

Even when the damage layer DML is formed on the substrate SUB, the occurrence of leakage defect during reverse bias of the semiconductor device having an IGBT can be effectively suppressed by preventing the parasitic diode Ds from operating during reverse bias. Two typical embodiments related to the method of preventing the parasitic diode Ds from operating will be described below.

First Embodiment

Figure 3:
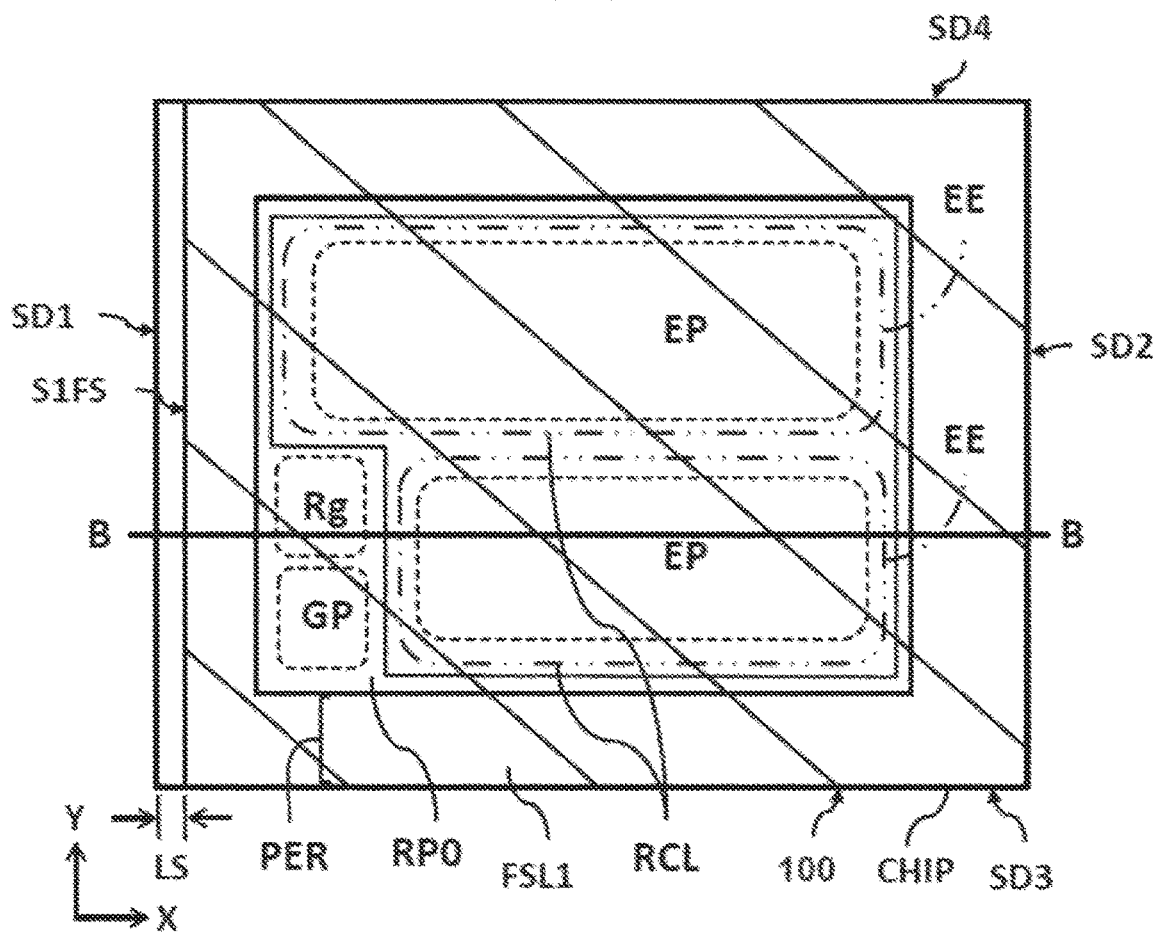
FIG. 3 is a plan view of a semiconductor device having an IGBT according to the first embodiment.
Figure 4:
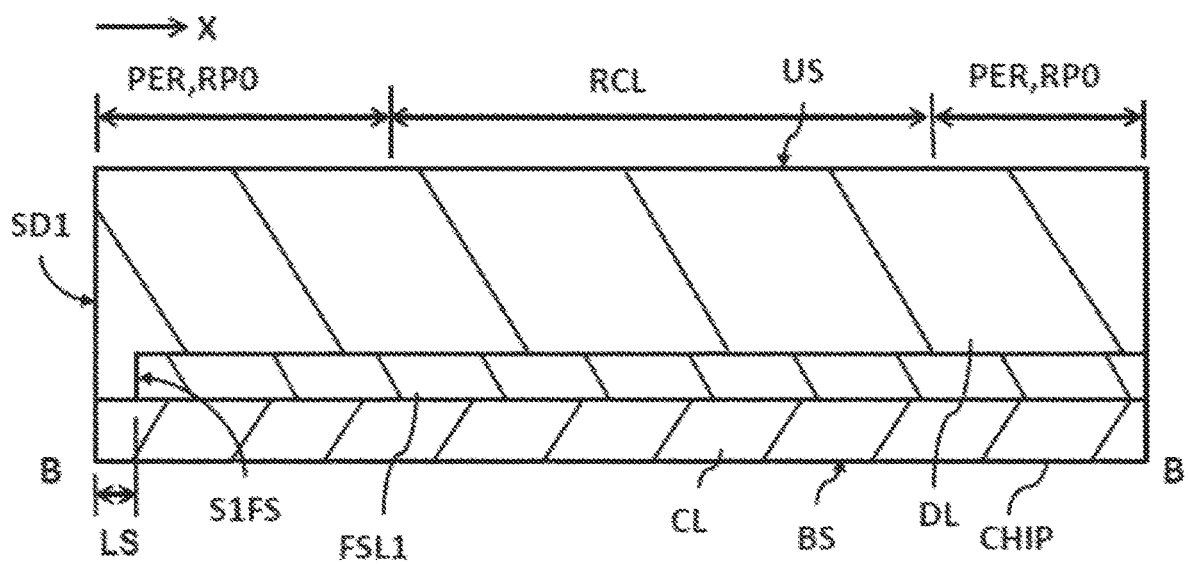
FIG. 4 is a schematic cross-sectional view of the semiconductor device along a line B-B in FIG. 3.
Figure 5:
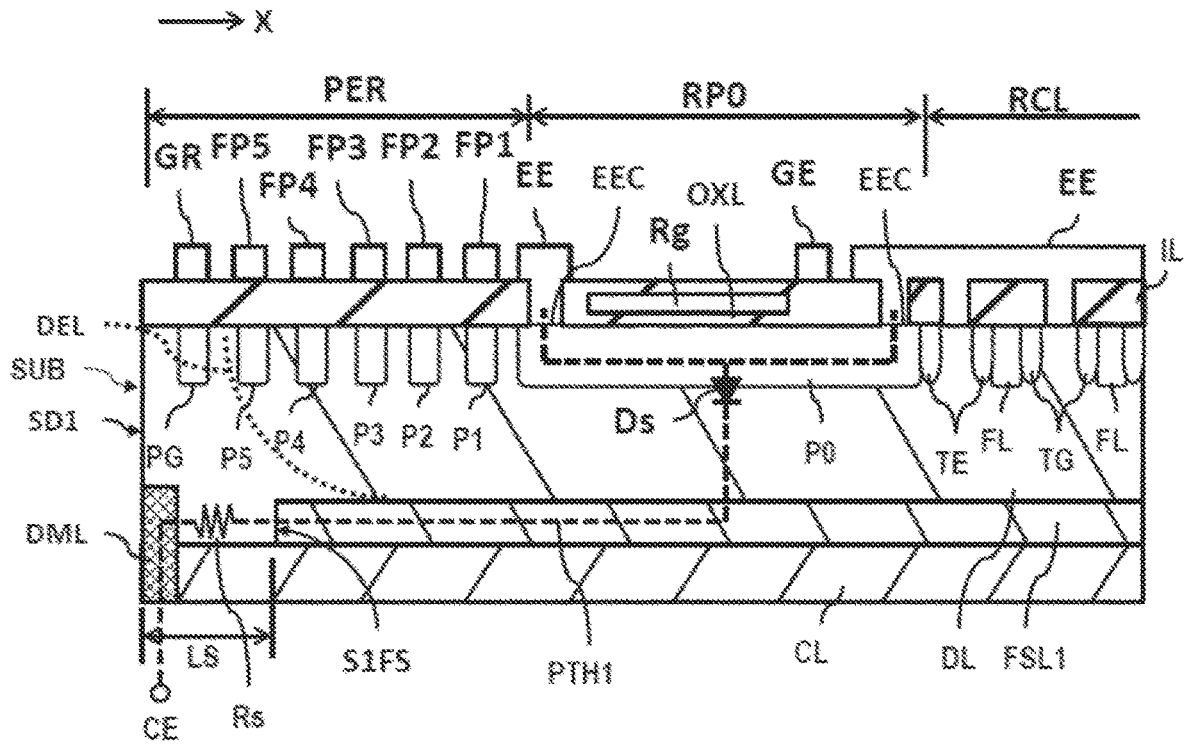
FIG. 5 is a cross-sectional view showing a principal part of the semiconductor device having the IGBT according to the first embodiment.

In the first embodiment, the n-type field stop layer is not provided on the entire surface of the semiconductor chip, but the n-type field stop layer is provided such that one side surface of the n-type field stop layer is separated from one side surface of the semiconductor chip by a predetermined distance (LS) in a plan view. FIG. 3 is a plan view of the semiconductor device having an IGBT according to the first embodiment. FIG. 4 is a schematic cross-sectional view of the semiconductor device along a line B-B in FIG. 3. FIG. 5 is a cross-sectional view showing a principal part of the semiconductor device having the IGBT according to the first embodiment.

The point where FIG. 3 is different from FIG. 1 is that an n-type field stop layer FSL1 is provided such that one end portion S1FS of the n-type field stop layer FSL1 is separated from one side surface SD1 of a semiconductor chip CHIP by a predetermined distance LS. The semiconductor chip CHIP (or substrate SUB) has a rectangular shape in a plan view, and has a first side surface SD1, a second side surface SD2 facing the first side surface SD1, a third side surface SD3 provided between the first side surface SD1 and the second side surface SD2, and a fourth side surface SD4 facing the third side surface SD3. The first side surface SD1, the second side surface SD2, the third side surface SD3, and the fourth side surface SD4 are dicing surfaces (cutting surfaces) cut by the dicing process. It can be said that the first side surface SD1 is a side surface relatively close to a built-in gate resistance (resistance element) Rg and a gate pad GP. Since the other configurations of FIG. 3 are the same as those of FIG. 1, redundant description will be omitted.

FIG. 4 is a diagram for describing a configuration example of a back surface BS of the semiconductor chip CHIP, and illustration of the configuration on a side of a front surface US of the semiconductor chip CHIP is omitted in order to prevent the drawing from being complicated. As shown in FIG. 4, a p-type collector layer CL is entirely provided on the back surface BS of the semiconductor chip CHIP, and the n-type field stop layer FSL1 is selectively provided on an upper side of (or inside) the p-type collector layer CL such that the first end portion S1FS of the n-type field stop layer FSL1 is separated from the first side surface SD1 of the semiconductor chip CHIP by the predetermined distance LS. Namely, an n-type drift layer DL having an impurity concentration lower than that of the n-type field stop layer FSL1 is present between the first side surface SD1 of the semiconductor chip CHIP and the first end portion S1FS of the n-type field stop layer FSL1. Therefore, a resistance value of the n-type drift layer DL is higher than a resistance value of the n-type field stop layer FSL1.

Figure 2:
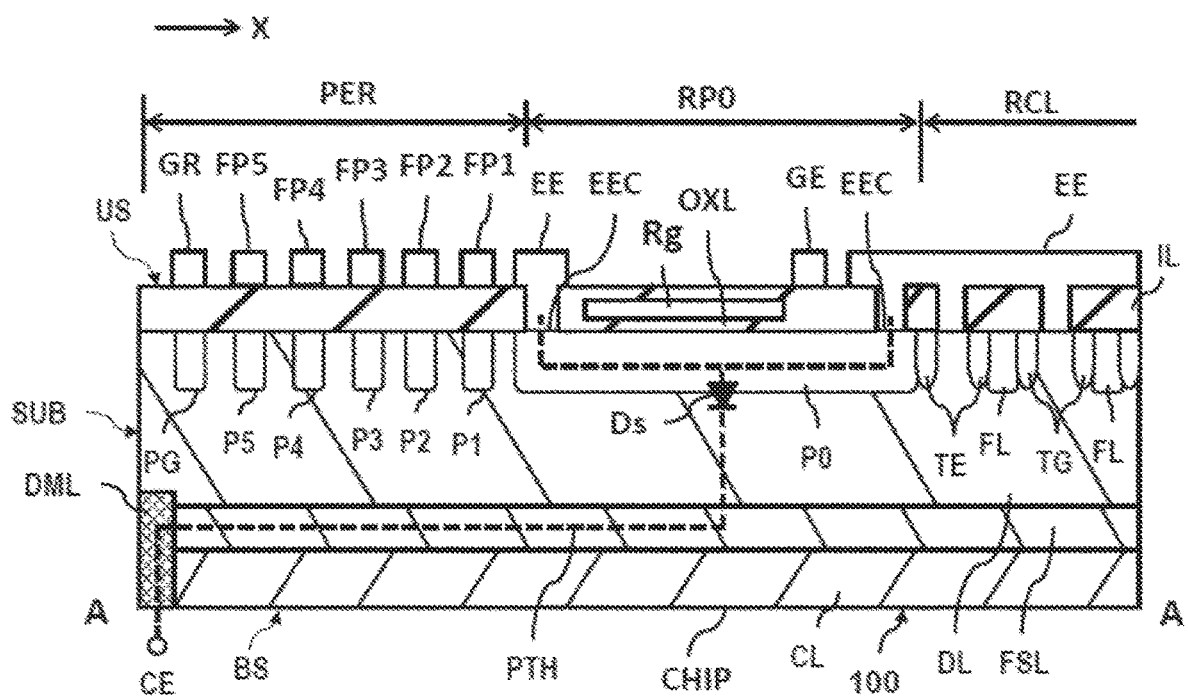
FIG. 2 is a cross-sectional view along a line A-A in FIG. 1.

FIG. 5 schematically shows a state of a leakage path PTH1 in the case where a damage layer DML is present on the first side surface SD1 of the semiconductor chip CHIP. The point where the leakage path PTH1 shown in FIG. 5 is different from the leakage path PTH shown in FIG. 2 is that a part of the n-type drift layer DL present between the first side surface SD1 of the semiconductor chip CHIP and the one end portion S1FS of the n-type field stop layer FSL1 is shown as a parasitic resistance Rs. The parasitic resistance Rs is inserted in the leakage path PTH1 extending from a collector electrode CE to a cathode of the parasitic diode Ds.

Therefore, since a voltage drop occurs in the parasitic resistance Rs during the reverse bias in which the potential of the emitter electrode EE is higher than the potential of the collector electrode CE, the potential between the anode and the cathode of the parasitic diode Ds is prevented from reaching the potential equal to or higher than the threshold value of the parasitic diode Ds. As a result, even when the damage layer DML is present on the first side surface SD1 of the semiconductor chip CHIP (substrate SUB), the parasitic diode Ds can be prevented from operating during the reverse bias, so that the occurrence of leakage defect during the reverse bias of the semiconductor device 100 having the IGBT can be suppressed. Further, since the parasitic diode Ds does not operate, even in the case of high-speed switching from the reverse bias state to the forward bias state, the breakage of an oxide film OXL located below the built-in gate resistance Rg is suppressed. Therefore, it is possible to provide the semiconductor device 100 having the IGBT capable of supporting the high-speed switching.

Here, a range of the predetermined distance LS will be described with reference to FIG. 5. In FIG. 5, as described in FIG. 2, the width of the chip outer peripheral region PER in the first direction X is about 400 to 600 µm, and the interval between the emitter contacts EEC at both ends of the p-type well region P0 in the first direction X is about 1 to 4 mm. Assuming that the damage layer DML is the chipping by the dicing process, the width of the damage layer DML in the first direction X is about 20 µm. Considering this, the value of the predetermined distance LS is preferably about 30 µm (20 µm+10 µm) or more. On the other hand, if the n-type field stop layer FSL1 is deleted by the predetermined distance LS, there is concern about the punch-through during the forward bias in which the potential of the collector electrode CE becomes higher than the potential of the emitter electrode EE. However, since a depletion layer DEL spreads as indicated by the fine dotted line in FIG. 5, there is no problem even if the n-type field stop layer FSL1 is not provided on the side of the first side surface SD1 of the semiconductor chip CHIP. For example, in a floating field ring structure having p-type floating field rings P1 to P5 of the chip outer peripheral region PER as shown in FIG. 5, the n-type field stop layer FSL1 can be separated from the first side surface SD1 of the semiconductor chip CHIP by about 200 to 300 µm. Therefore, the range of the predetermined distance LS is preferably about 30 to 300 µm, more preferably about 30 to 200 µm.

Second Embodiment

Figure 6:
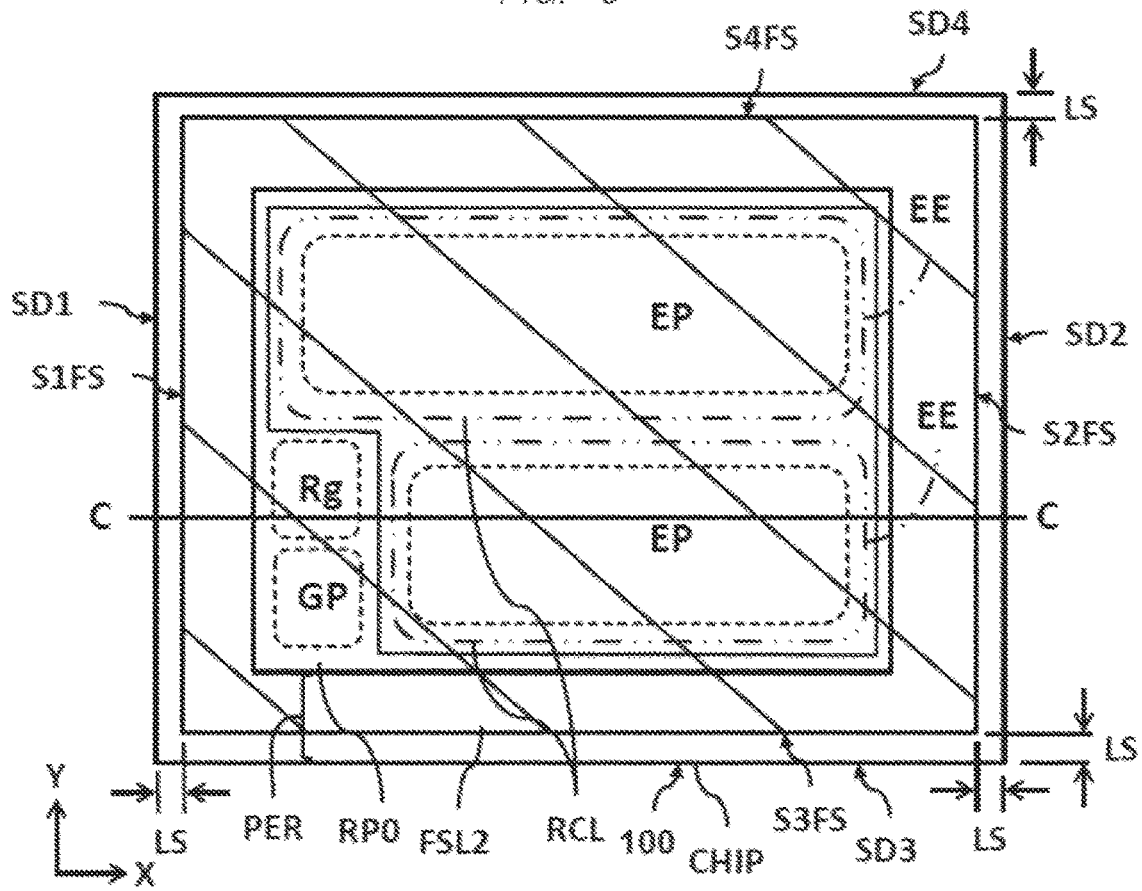
FIG. 6 is a plan view of a semiconductor device having an IGBT according to the second embodiment.
Figure 7:
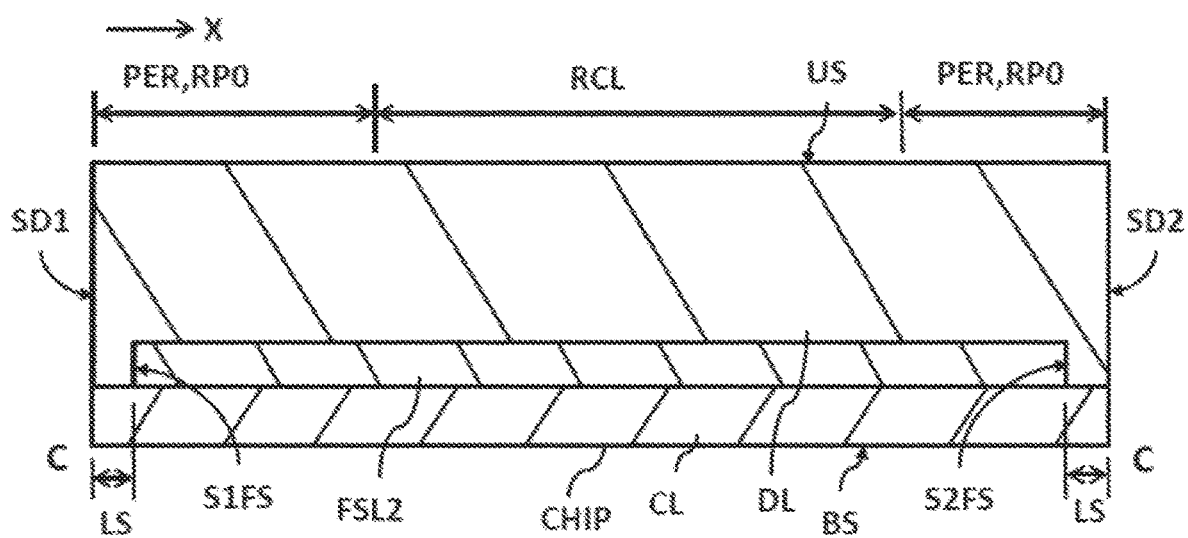
FIG. 7 is a schematic cross-sectional view of the semiconductor device along a line C-C in FIG. 6.

In the second embodiment, the n-type field stop layer is provided such that four end portions of the n-type field stop layer are separated from four side surfaces of the semiconductor chip by a predetermined distance (LS). FIG. 6 is a plan view of a semiconductor device having an IGBT according to the second embodiment. FIG. 7 is a schematic cross-sectional view of the semiconductor device along a line C-C in FIG. 6.

As shown in FIG. 6, an n-type field stop layer FSL2 has a first end portion S1FS, a second end portion S2FS facing the first end portion S1FS, a third end portion S3FS provided between the first end portion S1FS and the second end portion S2FS, and a fourth end portion S4FS facing the third end portion S3FS. As shown in FIG. 6 and FIG. 7, the first end portion S1FS of the n-type field stop layer FSL2 and the first side surface SD1 of the semiconductor chip CHIP are separated by a predetermined distance LS. Similarly, the second end portion S2FS of the n-type field stop layer FSL2 and the second side surface SD2 of the semiconductor chip CHIP are also separated by the predetermined distance LS, the third end portion S3FS of the n-type field stop layer FSL2 and the third side surface SD3 of the semiconductor chip CHIP are also separated by the predetermined distance LS, and the fourth end portion S4FS of the n-type field stop layer FSL2 and the fourth side surface SD4 of the semiconductor chip CHIP are also separated by the predetermined distance LS. Namely, the n-type drift layer DL having an impurity concentration lower than the impurity concentration of the n-type field stop layer FSL2 is present between the first end portion S1FS of the n-type field stop layer FSL2 and the first side surface SD1 of the semiconductor chip CHIP and between the second end portion S2FS of the n-type field stop layer FSL2 and the second side surface SD2 of the semiconductor chip CHIP. Similarly, the n-type drift layer DL having an impurity concentration lower than the impurity concentration of the n-type field stop layer FSL2 is present between the third end portion S3FS of the n-type field stop layer FSL2 and the third side surface SD3 of the semiconductor chip CHIP and between the fourth end portion S4FS of the n-type field stop layer FSL2 and the fourth side surface SD4 of the semiconductor chip CHIP. The n-type field stop layer FSL2 is selectively provided on the upper side of the p-type collector layer CL such that the first to fourth end portions S1FS to S4FS of the n-type field stop layer FSL2 are separated from the first to fourth side surfaces SD1 to SD4 of the semiconductor chip CHIP by the predetermined distance LS.

As described in the first embodiment, the value of the predetermined distance LS is preferably about 30 to 300 µm, more preferably about 30 to 200 µm. Each of the four predetermined distances LS may be the same value, but they, of course, do not have to be the same value and may be any value within the range of about 30 to 200 µm.

According to the second embodiment, even when the damage layer DML is present on any of the first side surface SD1, the second side surface SD2, the third side surface SD3, and the fourth side surface SD4 of the semiconductor chip CHIP (substrate SUB), the parasitic diode Ds can be prevented from operating during the reverse bias. Consequently, it is possible to suppress the occurrence of the leakage defect during the reverse bias of the semiconductor device having the IGBT. Further, as in the first embodiment, the semiconductor device 100 having the IGBT capable of supporting the high-speed switching can be provided.

(Configuration Example of Semiconductor Device Having IE-IGBT)

Figure 8:
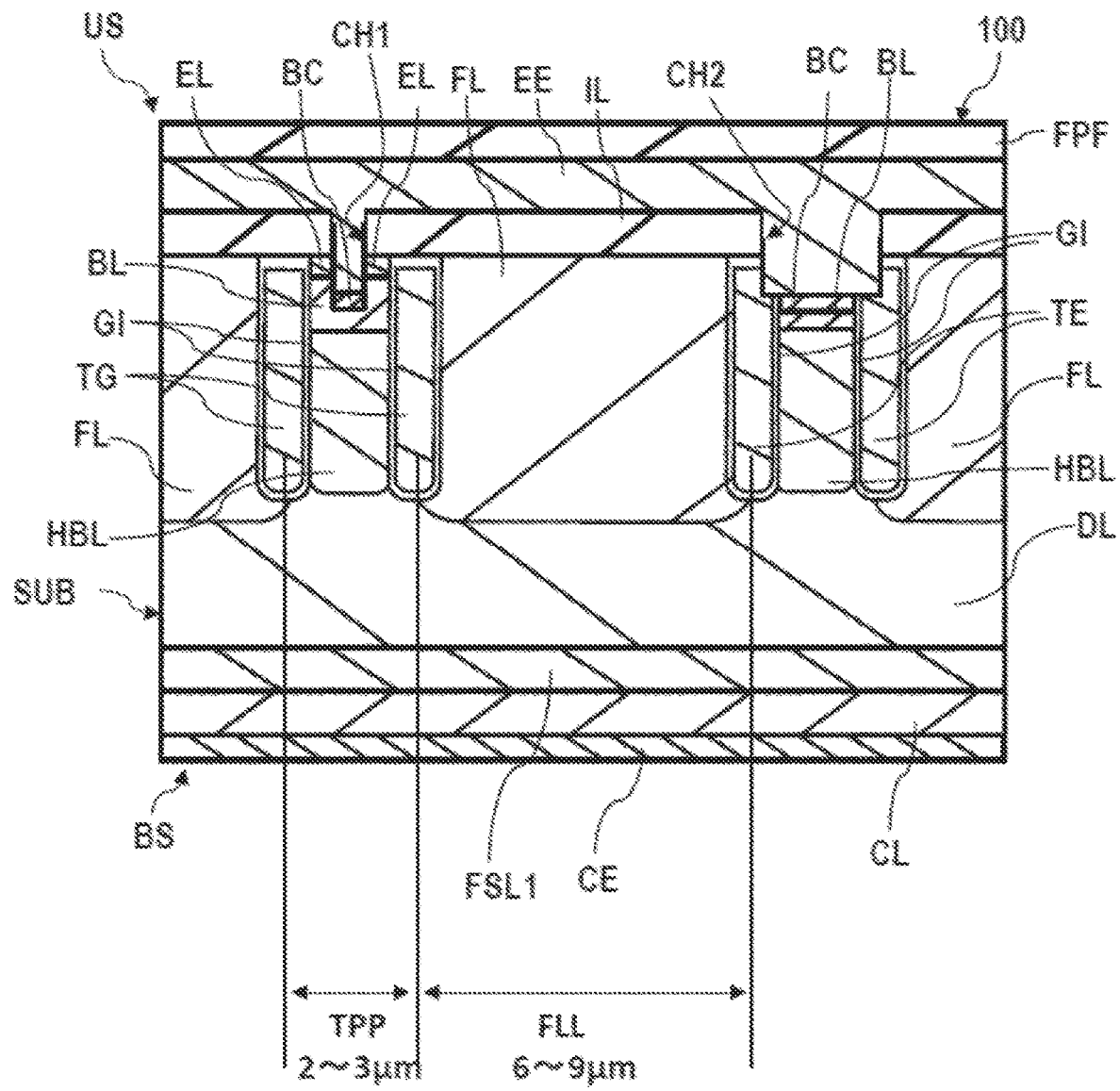
FIG. 8 is a cross-sectional view showing a principal part for describing a cell structure of the semiconductor device having the IGBT according to one embodiment.

FIG. 8 shows an example of an IE-IGBT having the n-type field stop layer FSL1 described in FIG. 3 and FIG. 4. As shown in FIG. 8, the semiconductor device 100 having an IE-IGBT (hereinafter, referred to also as IE-IGBT) includes trench gates TG, trench emitters TE, p-type base layers BL, an n-type emitter layer EL, a p-type floating layer FL, and n-type hole barrier layers HBL on the side of the main surface US of the substrate SUB made of n-type silicon. The IE-IGBT 100 further includes the n-type drift layer DL arranged below the n-type hole barrier layer HBL, the n-type field stop layer FSL1 arranged below the n-type drift layer DL, the p-type collector layer CL arranged below the n-type field stop layer FSL1, and the collector electrode CE arranged below the p-type collector layer CL. The emitter electrode EE is electrically connected to the p-type base layer BL and the n-type emitter layer EL via a connection hole CH1 formed in an interlayer insulating film IL. A reference character BC denotes a high-concentration p-type base contact layer formed on a surface of the p-type base layer BL. Further, the emitter electrode EE is electrically connected to the p-type base layer BL formed between the trench emitters TE and the trench emitters TE via a connection hole CH2 formed in the interlayer insulating film IL. An insulating film FPF is formed on the emitter electrode EE. The insulating film FPF is a final passivation film made of, for example, an organic insulating film composed mainly of polyimide.

The IE-IGBT 100 incorporates a parasitic p-channel MOSFET having the p-type floating layer FL as a source region, the p-type base layer BL as a drain region, and the trench emitter TE as a gate electrode. The n-type hole barrier layer HBL constitutes a channel formation region of the parasitic p-channel MOSFET. By this parasitic p-channel MOSFET, the holes accumulated in the p-type floating layer FL are discharged to the emitter electrode EE through a short path at the time of switching of the IGBT, so that the switching time can be shortened. Further, since the potential variation of the p-type floating layer FL is suppressed, the potential of the trench gate TG is stabilized and the switching loss at the time of switching can be suppressed. In addition to these effects, since the IE-IGBT 100 has the n-type field stop layer FSL1, the current leakage between the emitter and the collector during the reverse bias can be suppressed.

Materials and shapes of semiconductor layers, insulating films, and electrodes constituting the IE-IGBT 100 will be briefly described below.

First, the substrate SUB is made of single crystal silicon to which an n-type impurity such as phosphorus (P) is introduced, the impurity concentration thereof is, for example, about $2\times10^{14}$ cm$^{-3}$, and this concentration is the impurity concentration of the drift layer DL. Also, the thickness of the substrate SUB is, for example, about 450 μm to 1000 μm.

The n-type hole barrier layer HBL is formed by introducing an n-type impurity from the side of the front surface US of the substrate SUB. The ion implantation using phosphorus as ionic species, the dose amount of about $6\times10^{12}$ cm$^{-2}$, and the implantation energy of about 200 keV can be presented as a suitable example of the introduction of the n-type impurity. Further, the n-type hole barrier layer HBL functions as a barrier for holes, which suppresses the holes from reaching the p-type base layer BL to be discharged during the operation of the IE-IGBT. The impurity concentration of the n-type hole barrier layer HBL is set higher than the n-type impurity concentration of the n-type drift layer DL and lower than the n-type impurity concentration of the n-type emitter layer EL described later.

The p-type floating layer FL is formed by introducing a p-type impurity from the side of the front surface US of the substrate SUB. The ion implantation using boron (B) as ionic species, the dose amount of about $3.5\times10^{13}$ cm$^{-2}$, and the implantation energy of about 75 keV can be presented as a suitable example of the introduction of the p-type impurity.

The trench gates TG and the trench emitters TE are made of a polycrystalline silicon layer doped with an n-type impurity formed so as to be buried in trenches formed by etching in the main surface of the substrate SUB. The trench gate TG and the trench emitter TE are electrically separated from the semiconductor layers formed on the substrate SUB by gate insulating films GI. The thickness of the gate insulating film GI is, for example, about 0.10 to 0.12 μm.

As a suitable example of the depth and width of the trenches, 3.0 μm and 0.5 to 1.0 μm can be presented. Also, the trenches are formed to have a stripe shape in a plan view, each of the trench gates TG and the trench emitters TE are arranged so as to face each other and sandwich the hole barrier layer HBL, and the p-type floating layer FL is arranged between the trench gate TG and the trench emitter TE. As a suitable example of the thickness (or the depth) of the p-type floating layer FL, 4 to 5 μm can be presented and the bottom surface portion of the p-type floating layer FL is formed so as to cover the bottom surface portion of the trench, so that the electric field concentration at the bottom surface of the trench gate TG can be relieved.

The p-type base layers BL are formed by introducing a p-type impurity from the side of the front surface US of the substrate SUB. The ion implantation using boron as ionic species, the dose amount of about $3\times10^{13}$ cm$^{-2}$, and the implantation energy of about 75 keV can be presented as a suitable example of the introduction of the p-type impurity.

The p-type base layer BL is formed on the n-type hole barrier layer HBL so as to be in contact with one side surface of the trench gate TG via the gate insulating film GI. Also, the p-type base layer BL is formed on the n-type hole barrier layer HBL so as to be in contact with one side surface of the trench emitter TE via the gate insulating film GI.

The n-type emitter layer EL is formed by introducing an n-type impurity into the surface of the p-type base layer BL. The ion implantation using arsenic as ionic species, the dose amount of about $5\times10^{15}$ cm$^{-2}$, and the implantation energy of about 80 keV can be presented as a suitable example of the introduction of the n-type impurity.

The interlayer insulating film IL is formed over the main surface of the substrate SUB so as to cover the n-type emitter layer EL, the p-type base layers BL, and the p-type floating layer FL. The interlayer insulating film IL is, for example, a PSG (Phosphorus Silicate Class) film formed by the CVD method or the like. The thickness of the interlayer insulating film IL is, for example, about 0.6 μm. A BPSG (Boron Phosphorus Silicate Glass) film, an NSG (Non-doped Silicate Glass) film, an SOG (Spin On Glass) film, a composite film of these, and the like can be presented as a suitable example of the material of the interlayer insulating film IL other than the PSG film.

Connection holes CH1 and CH2 are formed in the interlayer insulating film IL. The connection holes CH1 and CH2 can be formed by, for example, anisotropic dry etching using Ar gas, CHF$_3$ gas, or the like. The parts of the main surface of the substrate SUB exposed through the connection holes CH1 and CH2 are etched by the anisotropic dry etching, so that the connection holes CH1 and CH2 reaching the middle of the p-type base layer BL and the trench emitter TE are formed.

The p-type base contact layers BC can be formed by introducing a p-type impurity into the surface of the substrate SUB through the connection holes CH1 and CH2. The ion implantation using boron as ionic species, the dose amount of about $1\times10^{15}$ cm$^{-2}$, and the implantation energy of about 100 keV can be presented as a suitable example of the introduction of the p-type impurity.

The emitter electrode EE is formed on the interlayer insulating film IL including the insides of the connection holes CH1 and CH2. The emitter electrode EE is formed as a stacked film by, for example, the following procedure. First, for example, a titanium tungsten film is formed as a barrier metal film on the main surface of the substrate SUB by the sputtering method. The thickness of the titanium tungsten film is, for example, about 0.2 μm.

Next, after performing silicide annealing at about 600° C. for about 10 minutes in a nitrogen atmosphere, an aluminum-based metal film is formed by, for example, the sputtering method on the entire surface of the titanium tungsten film such that the insides of the connection holes CH1 and CH2 are buried. The aluminum-based metal film is made of, for example, an aluminum film to which silicon is added by several percents, and has a thickness of about 5 μm.

Next, by processing the titanium tungsten film and the aluminum-based metal film into a predetermined pattern by the dry etching method using a resist pattern as a mask, the emitter electrode EE composed of the stacked film of the titanium tungsten film and the aluminum-based metal film can be formed. As a suitable example of the gas of the dry etching, Cl$_2$/BCl$_3$ gas or the like can be presented.

The emitter electrode EE is electrically connected to each of the n-type emitter layer EL, the p-type base contact layer BC, and the trench emitter TE via the connection holes formed in the interlayer insulating film IL.

Next, the final passivation film FPF is formed on the upper side of the emitter electrode EE and the interlayer insulating film IL. The final passivation film FPF is, for example, an organic film composed mainly of polyimide, and has a thickness of, for example, about 10 μm. The final passivation film FPF is formed by entirely applying this organic film to the upper side of the emitter electrode EE and the interlayer insulating film IL and forming openings in the parts of the organic film corresponding to the emitter pad EP and the gate pad GP by normal lithography.

After forming the final passivation film FPF, the following process is applied to the back surface BS of the substrate SUB.

By performing the back grinding process to the back surface BS of the substrate SUB, the thickness of about 800 μm, which is the initial thickness of the substrate SUB, is reduced to, for example, about 30 μm to 200 μm as needed. When designing the withstand voltage of the IE-IGBT 100 to, for example, about 600 V, it is preferable to set the final thickness of the substrate SUB about 70 μm. Further, if necessary, chemical etching can be applied to the back surface BS in order to remove damage due to the back grinding process.

Next, the n-type field stop layer FSL1 is formed by selectively introducing an n-type impurity into the back surface BS of the thinned substrate SUB by, for example, the ion implantation method. As a suitable example of the ion implantation conditions at this time, for example, ionic species is phosphorus P, the dose amount is about $5 \times 10^{12}$ to $1 \times 10^{13}$ cm$^{-2}$, and the implantation energy is about 300 to 400 keV.

Next, the p-type collector layer CL is formed by introducing a p-type impurity into the back surface BS of the thinned substrate SUB by, for example, the ion implantation method. As a suitable example of the ion implantation conditions for forming the p-type collector layer CL, for example, ionic species is boron, the dose amount is about $1 \times 10^3$ to $3 \times 10^3$ cm$^2$, and the implantation energy is about 20 to 100 keV. Note that it is also possible to form the n-type field stop layer FSL1 and the p-type collector layer CL by sequentially introducing an n-type impurity and a p-type impurity and performing the laser annealing to the back surface BS of the substrate SUB.

Next, the collector electrode CE is formed on the surface of the p-type collector layer CL by, for example, the sputtering method. The collector electrode CE can be formed by, for example, a stacked film including an aluminum (Al) layer, a titanium (Ti) layer, a nickel (Ni) layer, and a gold (Au) layer formed in this order from the back surface BS of the substrate SUB.

Through the manufacturing process described above, the IE-IGBT shown in FIG. 8 can be manufactured. Here, in order to show the device structure more specifically, an example of major dimensions of each component of the device will be described.

The trench pitch interval TPP between the trench emitters TE and between the trench gates TG is about 2 urn to 3 μm, the width FLL of the p-type floating layer FL is about 6 to 9 μm, and these are so-called cell pitch and cell-to-cell pitch, respectively. Also, the depth of the n-type emitter layer EL is about 200 nm, the depth of the p-type base layer BL is about 0.6 to 1.0 μm, and the depth of the p-type floating layer FL is about 4 to 5 μm. Further, the thickness of the n-type field stop layer FSL is about 1.5 to 2.0 μm, and the thickness of the p-type collector layer CL is about 0.5 to 1.0 μm. Note that the thickness of the substrate SUB can be changed in accordance with the required withstand voltage. As a suitable example of the thickness of the substrate SUB, the thickness of about 120 μm can be presented when the required withstand voltage is 1200 volts and the thickness of about 70 μm can be presented when the required withstand voltage is 600 volts.

Figure 9:
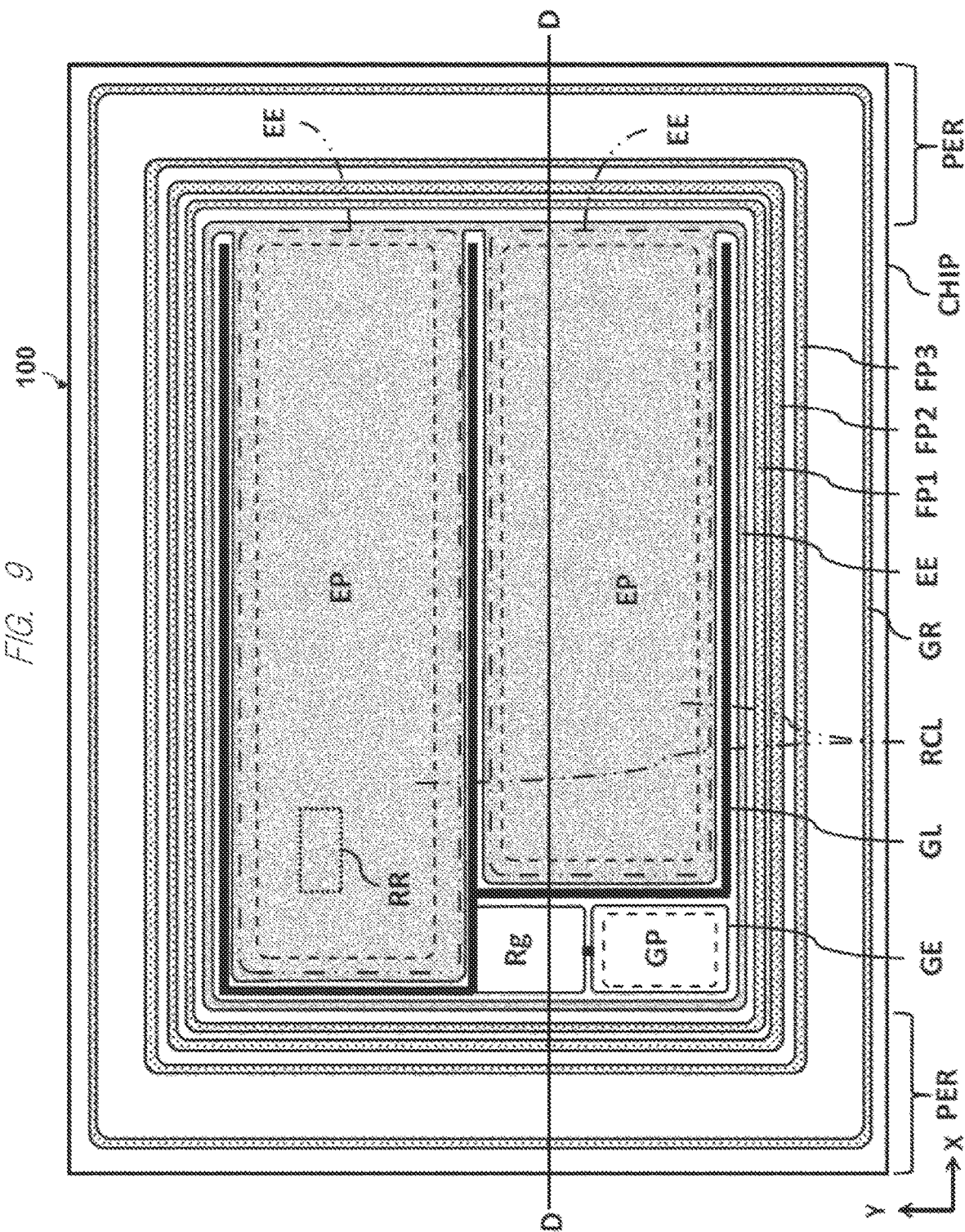
FIG. 9 is a plan view of the semiconductor device having the IGBT according to one embodiment.
Figure 10:
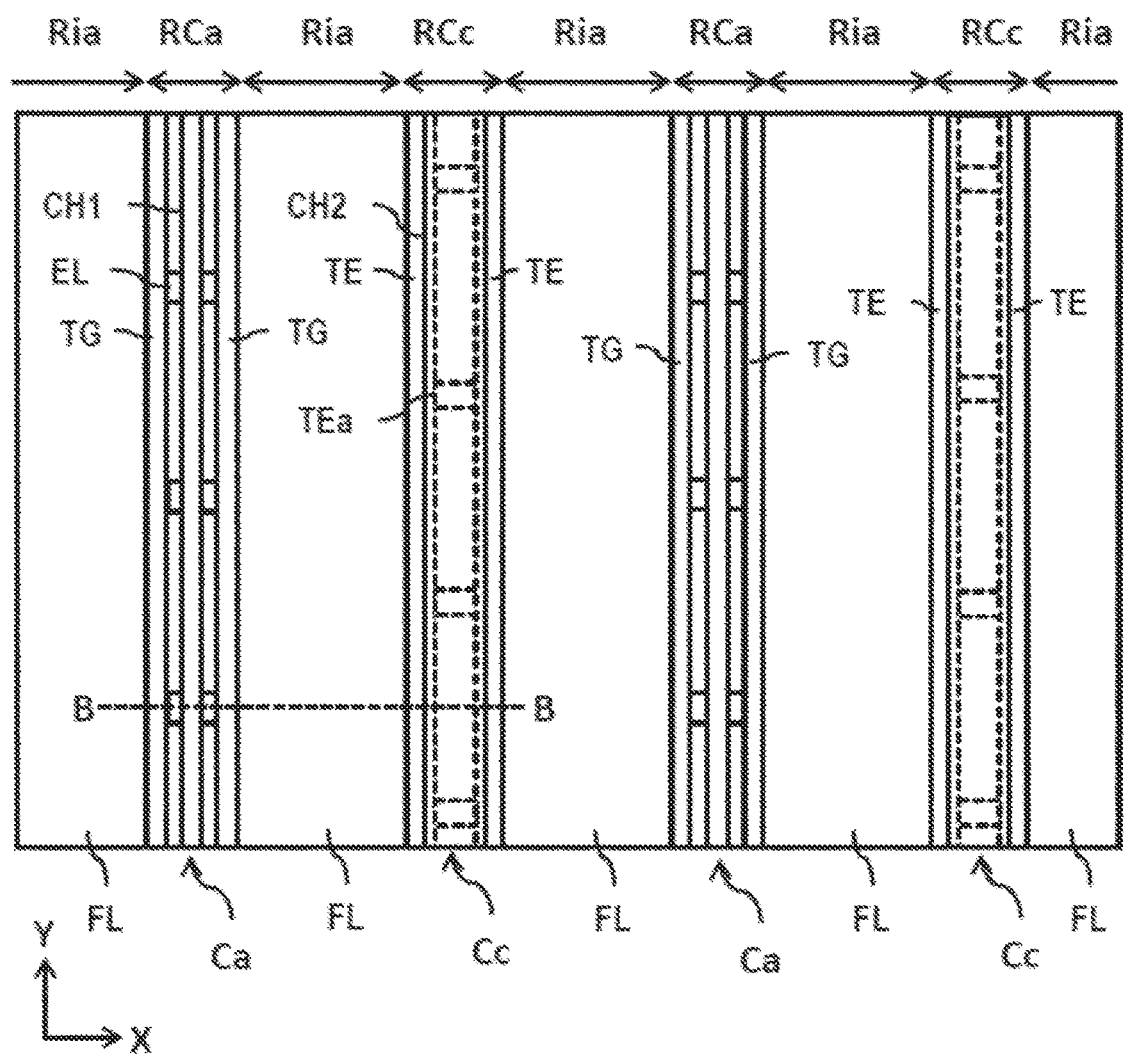
FIG. 10 is a diagram for describing a cell formation region and is a schematic enlarged plan view of a region RR in FIG. 9.
Figure 11:
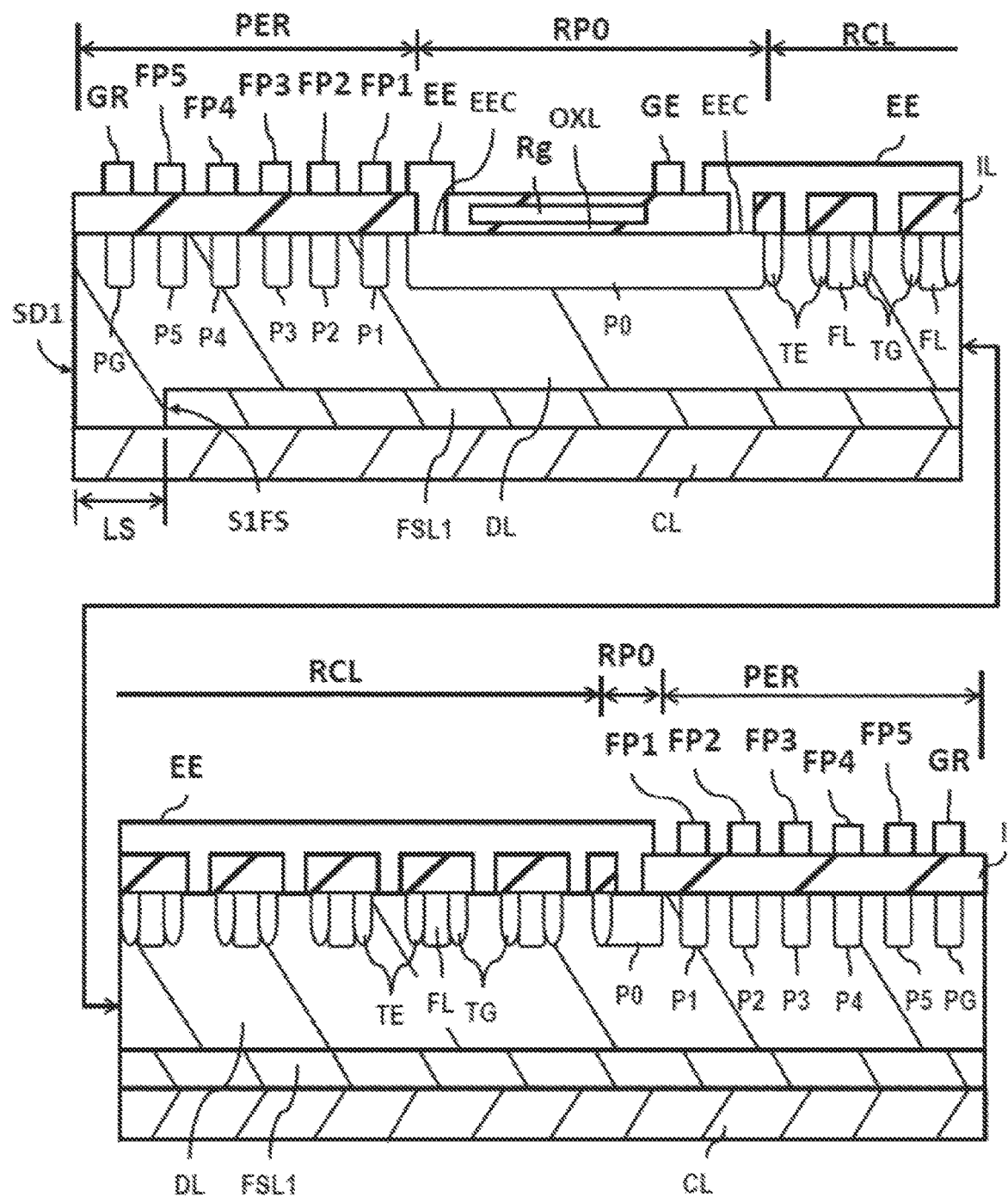
FIG. 11 is a schematic cross-sectional view along a line D-D in FIG. 9.

FIG. 9 is a plan view of the semiconductor device having the IGBT according to one embodiment. FIG. 10 is a diagram for describing the cell formation region and is a schematic enlarged plan view of a region RR in FIG. 9. FIG. 11 is a schematic cross-sectional view along a line D-D in FIG. 9.

In the IE-IGBT 100, as shown in FIG. 9, an annular guard ring GR connected to an annular channel stopper PG is provided on the upper surface of the outer peripheral portion (referred to also as the chip outer peripheral region) PER of the rectangular semiconductor chip CHIP. Inside the guard ring GR, several (one or plural) annular field plates FP (FP1, FP2, FP3, FP4, FP5) connected to annular floating field rings (P1, P2, P3, P4, P5) and the like are provided. The guard ring GR and the field plate FP are made of, for example, a metal film composed mainly of aluminum. In FIG. 9, illustration of the annular field plates FP4 and FP5 of the annular field plates FP is omitted for the simplification of the drawing.

Cell formation regions RCL are provided inside the annular field plate FP and in a main active portion of the semiconductor chip CHIP, and the emitter electrodes EE are provided on an upper surface of the active portion of the semiconductor chip CHIP up to the vicinity of the outer peripheral portion PER of the semiconductor chip CHIP. The emitter electrode EE is made of, for example, a metal film composed mainly of aluminum. A central portion of the emitter electrode EE is the emitter pad EP for connecting a bonding wire or the like. The emitter pad EP is formed by providing an opening in the final passivation film FPF.

Gate wirings GL are arranged between the emitter electrodes EE and the like, and the gate wiring GL is connected to a gate electrode GE via the gate resistance Rg. The gate wiring GL and the gate electrode GE are made of, for example, a metal film composed mainly of aluminum. A central portion of the gate electrode GE is the gate pad GP for connecting the bonding wire or the like. The gate pad GP is formed by providing an opening in the final passivation film FPF. The gate resistance Rg is made of, for example, a resistive film composed mainly of polycrystalline silicon to which an impurity with a desired concentration is introduced.

In the configuration example shown in FIG. 9, three gate wirings GL are arranged so as to extend along the first direction X, and the three gate wirings GL extending in the first direction X are connected to two gate wirings GL arranged so as to extend in a second direction Y intersecting with the first direction X. Though not shown, the three gate wirings GL extending in the first direction X are electrically connected to the polycrystalline silicon layer doped with an n-type impurity buried in the trench of the trench gate TG below the formation region of the three gate wirings GL.

Next, a configuration example of the cell formation region RCL will be described with reference to FIG. 10. A cross-sectional view along a line B-B in FIG. 10 corresponds to the cross-sectional view of the IE-IGBT shown in FIG. 8. The cell formation region RCL includes an active cell region RCa, an inactive region Ria, and a hole collector cell region RCc. Each of the active cell region RCa, the inactive region Ria, and the hole collector cell region RCc is provided to have a stripe shape along the second direction Y. Also, four regions of the active cell region RCa, the inactive region Ria, the hole collector cell region RCc, and the inactive region Ria are defined in this order as one layout unit, and are repeatedly arranged in the first direction X.

An active cell Ca is formed in the active cell region RCa. In FIG. 10, a pair of the trench gates TG formed to have a stripe shape in the second direction Y and the n-type emitter layer EL provided between the pair of trench gates TG are schematically shown as the active cell Ca. A hole collector cell Cc is formed in the hole collector cell region RCc. As described in FIG. 8, the hole collector cell Cc is a parasitic p-channel MOSFET having the p-type floating layer FL as a source region, the p-type base layer BL as a drain region, the n-type hole barrier layer HBL as a channel formation region, and the trench emitter TE as a gate electrode. In FIG. 10, a pair of the trench emitters TE formed to have a stripe shape in the second direction Y and a connection trench emitter TEa connecting the pair of trench emitters TE are schematically shown as the hole collector cell Cc. In FIG. 10, the p-type floating layer FL is schematically shown in the inactive region Ria. Note that, when the connection hole CH2 is formed as in FIG. 8, the connection trench emitter TEa is unnecessary. When the connection hole CH2 is formed like the connection hole CH1, it is preferable to provide the connection trench emitter TEa.

Next, a cross-sectional view of the IE-IGBT 100 will be described with reference to FIG. 11. Note that illustrations of the final passivation film FPF and the collector electrode CE are omitted in FIG. 11. Also, as to the cell formation region RCL, only three layers of the trench emitters TE, the trench gates TG, and the p-type floating layers FL are shown in order to prevent the drawing from being complicated.

In an outer peripheral region of the cell formation region RCL, a portion RP0 (hereinafter, referred to also as a cell peripheral connection region) in which an annular p-type well region (referred to also as a p-type well region) P0 is provided is present so as to surround the cell formation region RCL, and the p-type well region P0 is electrically connected to the emitter electrode EE. A plurality of annular p-type floating field rings P1, P2, P3, P4, and P5 are provided outside the annular p-type well region P0. The floating field rings P1, P2, P3, P4 and P5 are connected to the field plates FP1, FP2, FP3, FP4, and FP5, respectively. The annular channel stopper PG is provided outside the p-type floating field rings P1, P2, P3, P4, and P5. The channel stopper PG is connected to the guard ring GR. It can be said that the outer peripheral portion PER of the semiconductor chip CHIP and the cell peripheral connection region RP0 are peripheral regions provided so as to surround the cell formation region RCL.

As shown in FIG. 11, the n-type field stop layer FSL1 is selectively formed on the upper side of the p-type collector layer CL. As described in FIG. 3 and FIG. 4, the n-type field stop layer FSL1 is not provided on the entire surface of the semiconductor chip, but the n-type field stop layer FSL1 is provided such that one side surface (first end portion S1FS) of the n-type field stop layer FSL1 is separated from one side surface (first side surface SD1) of the semiconductor chip CHIP by the predetermined distance LS in a plan view. The n-type field stop layer FSL1 shown in FIG. 11 can be replaced with the n-type field stop layer FSL2 shown in FIG. 6 and FIG. 7.

(Manufacturing Method)

An outline of the manufacturing method of the IE-IGBT 100 will be described. The manufacturing method of the IE-IGBT 100 basically includes the following steps A to D.

Step A (Silicon Substrate Preparing Step)

The step A is a step of preparing the silicon substrate SUB in which the n-type emitter layer EL, the p-type base layer BL, the p-type base contact layer BC, the trench gate TG, the trench emitter TE, the p-type floating layer FL, the n-type hole barrier layer HBL, the interlayer insulating film IL, the gate electrode GE, the emitter electrodes EE, the final passivation film FPF, and the like are formed on the side of the first main surface US. In the silicon substrate SUB mentioned here, the back surface BS thereof may be processed by the back grinding process.

Step B (Forming Step of p-Type Collector Layer and n-Type Field Stop Layer)

The step B is a step of forming the p-type collector layer CL on the second main surface BS facing the first main surface US of the silicon substrate SUB and selectively forming the n-type field stop layer (FSL1, FSL2) on the p-type collector layer CL on the side closer to the first main surface US. In this disclosure, various manufacturing methods are described for this step.

Step C (Forming Step of Collector Electrode)

The step C is a step of forming the collector electrode CE connected to the p-type collector layer CL by the sputtering method.

Step D (Dicing Step)

The step D is a step of cutting the silicon substrate SUB along a scribe line SCL by, for example, a dicing blade.

Hereinafter, some manufacturing methods will be described for the step B.

(Manufacturing Method of n-Type Field Stop Layer FSL1 Using Double-Sided Aligner)

Figure 12:
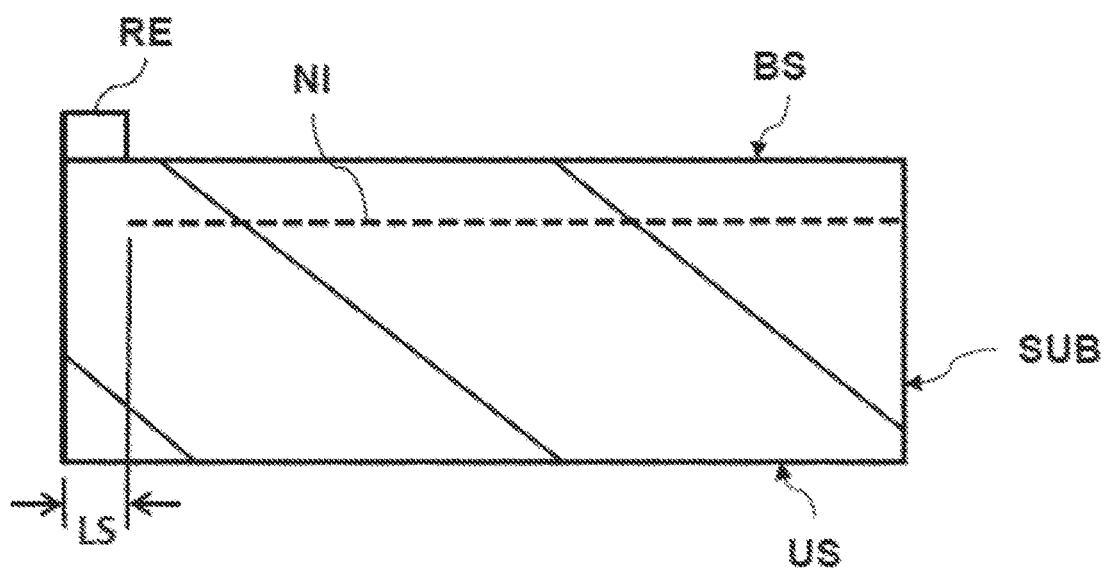
FIG. 12 is a cross-sectional view for describing a manufacturing method on a back surface side of the semiconductor device having the IGBT according to one embodiment.
Figure 13:
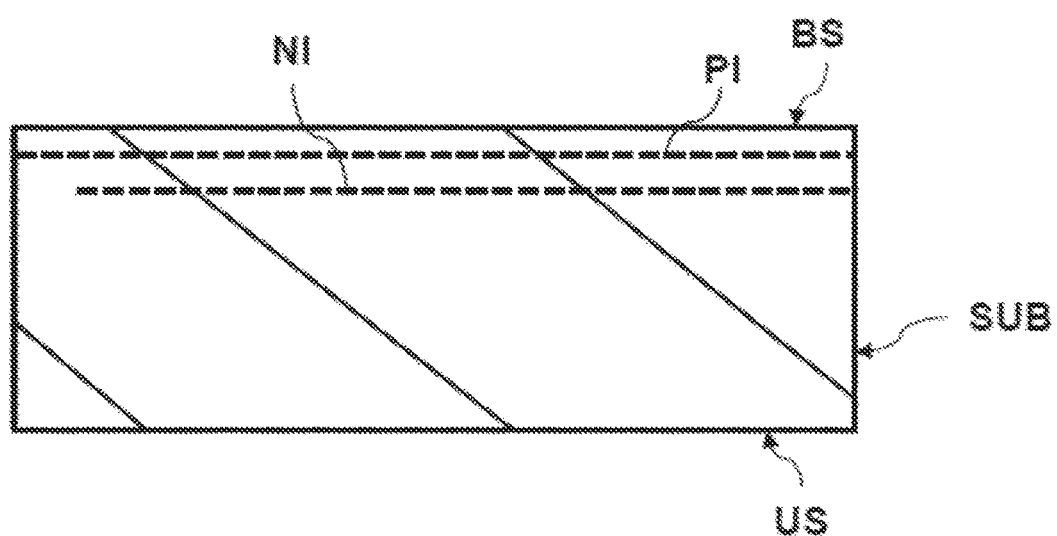
FIG. 13 is a cross-sectional view for describing the manufacturing method subsequent to FIG. 12.
Figure 14:
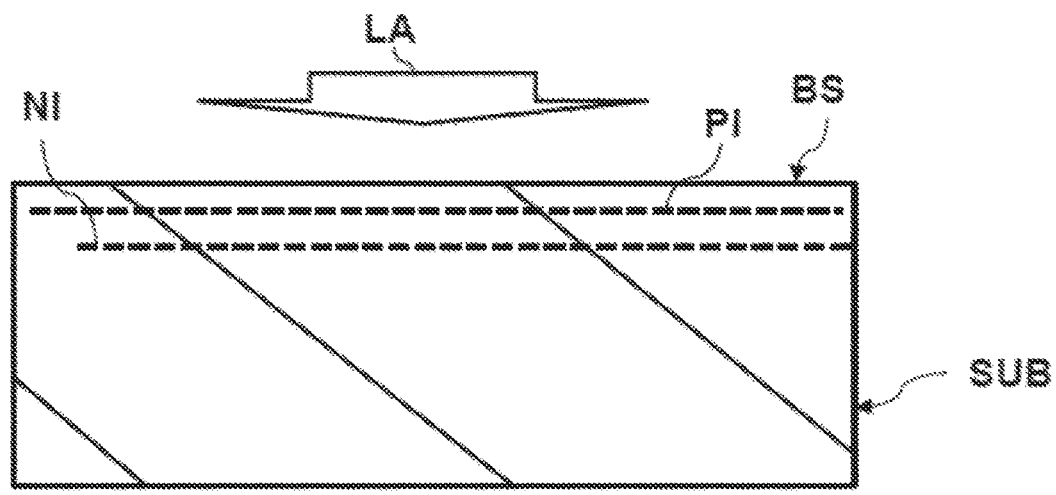
FIG. 14 is a cross-sectional view for describing the manufacturing method subsequent to FIG. 13.
Figure 15:
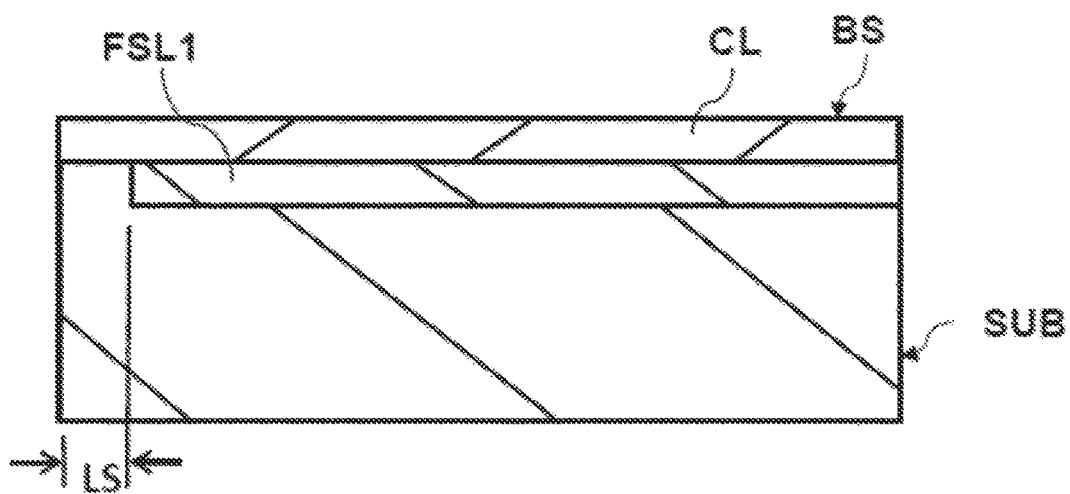
FIG. 15 is a cross-sectional view for describing the manufacturing method subsequent to FIG. 14.

Next, the manufacturing method of the IE-IGBT having the n-type field stop layer FSL1 will be described with reference to FIG. 12 to FIG. 15. FIG. 12 is a cross-sectional view for describing the manufacturing method on the back surface side of the semiconductor device having the IGBT. FIG. 13 is a cross-sectional view for describing the manufacturing method subsequent to FIG. 12. FIG. 14 is a cross-sectional view for describing the manufacturing method subsequent to FIG. 13. FIG. 15 is a cross-sectional view for describing the manufacturing method subsequent to FIG. 14. Here, the description will be given while omitting the n-type emitter layer EL, the p-type base layer BL, the p-type base contact layer BC, the trench gate TG, the trench emitter TE, the p-type floating layer FL, the n-type hole barrier layer HBL, the interlayer insulating film IL, the gate electrode GE, the emitter electrode EE, the final passivation film FPF, and the like formed on the side of the front surface US of the substrate SUB.

As shown in FIG. 12, after the back grinding process, a resist RE is selectively formed on the back surface BS of the substrate SUB by the back-surface photolithography process using the double-sided aligner. The width of the resist RE is the predetermined distance LS. Next, in order to form the n-type field stop layer FSL1, an n-type impurity is introduced into the back surface BS of the substrate SUB by, for example, the ion implantation method using the resist RE as an ion implantation mask, thereby forming an n-type impurity implanted layer NI. As the ion implantation conditions at this time, for example, ionic species is phosphorus P, the dose amount is about $5 \times 10^{12}$ to $1 \times 10^{13}$ cm$^{-2}$, and the implantation energy is about 200 to 400 keV.

Next, as shown in FIG. 13, the resist RE is removed from the back surface BS of the substrate SUB. Then, in order to form the p-type collector layer CL, a p-type impurity is introduced into the entire back surface BS of the substrate SUB by, for example, the ion implantation method, thereby forming a p-type impurity implanted layer PI. As the ion implantation conditions for forming the p-type collector layer CL, for example, ionic species is boron, the dose amount is about $1 \times 10^{13}$ to $3 \times 10^{13}$ cm$^{-2}$, and the implantation energy is about 20 to 100 keV.

Thereafter, as shown in FIG. 14, laser annealing LA is performed on the back surface BS of the substrate SUB to activate the p-type impurity implanted layer PI and the n-type impurity implanted layer NI, thereby forming the p-type collector layer CL and the n-type field stop layer FSL1 as shown in FIG. 15.

Thereafter, though not shown, the collector electrode CE is formed on the surface of the p-type collector layer CL by the sputtering method. Then, the semiconductor device having the IGBT is formed by singulating the semiconductor wafer along the scribe line by the dicing process. Consequently, it is possible to form the IE-IGBT having the n-type field stop layer FSL1 as described in FIG. 3 and FIG. 4.

(Manufacturing Method of n-Type Field Stop Layer FSL2 Using Double-Sided Aligner)

Figure 16:
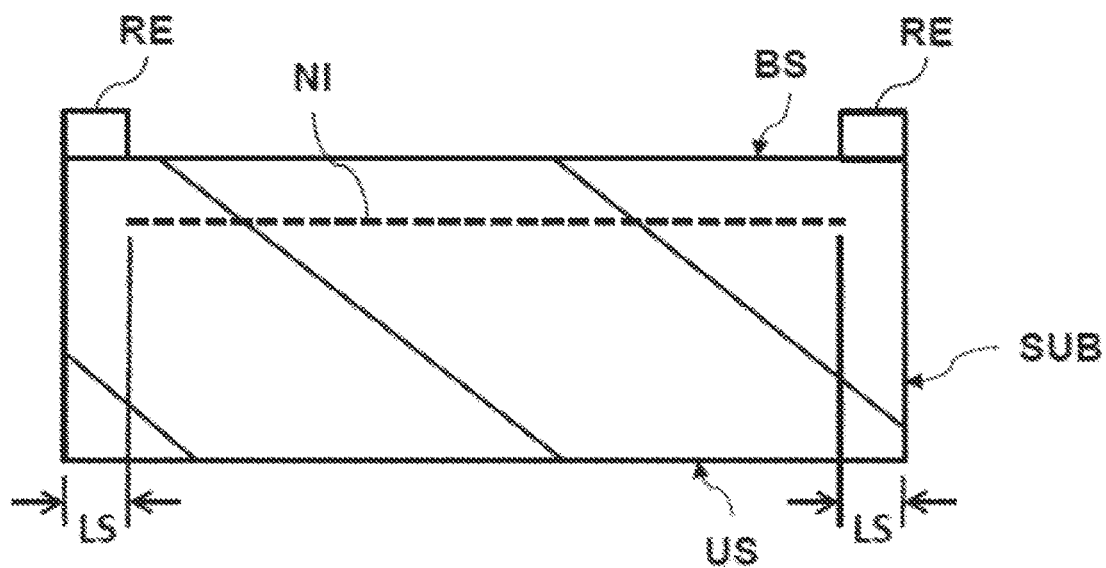
FIG. 16 is a cross-sectional view for describing a manufacturing method on a back surface side of the semiconductor device having the IGBT according to one embodiment.
Figure 17:
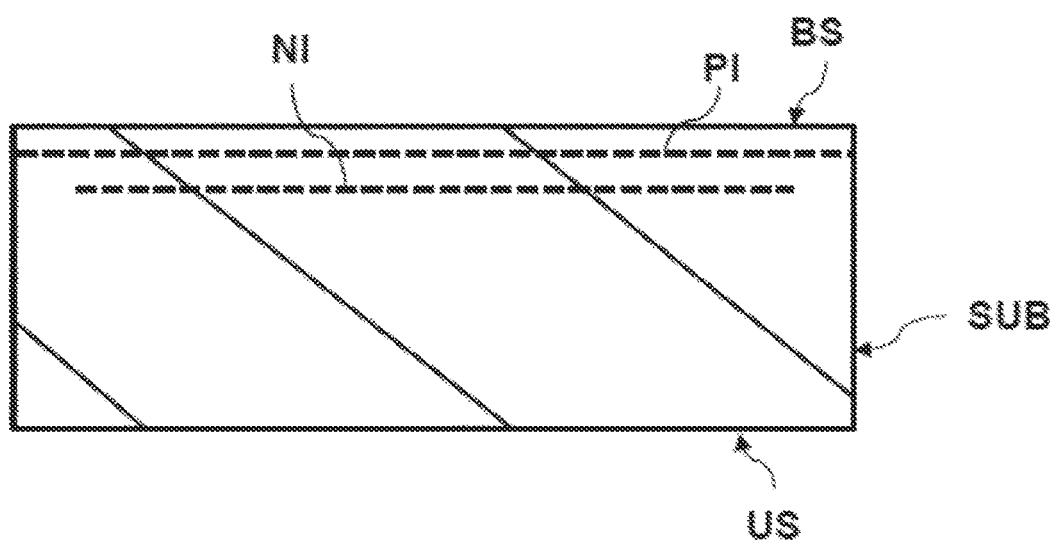
FIG. 17 is a cross-sectional view for describing the manufacturing method subsequent to FIG. 16.
Figure 18:
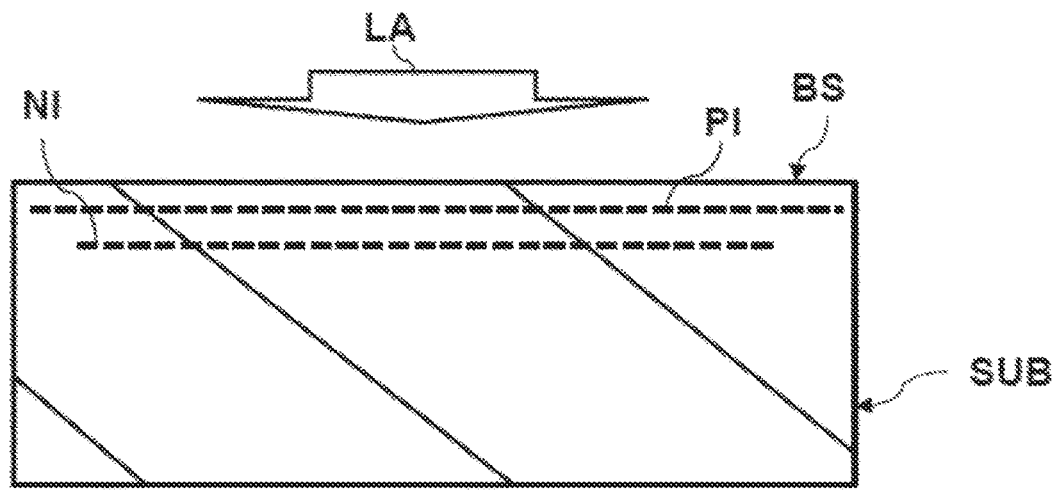
FIG. 18 is a cross-sectional view for describing the manufacturing method subsequent to FIG. 17.
Figure 19:
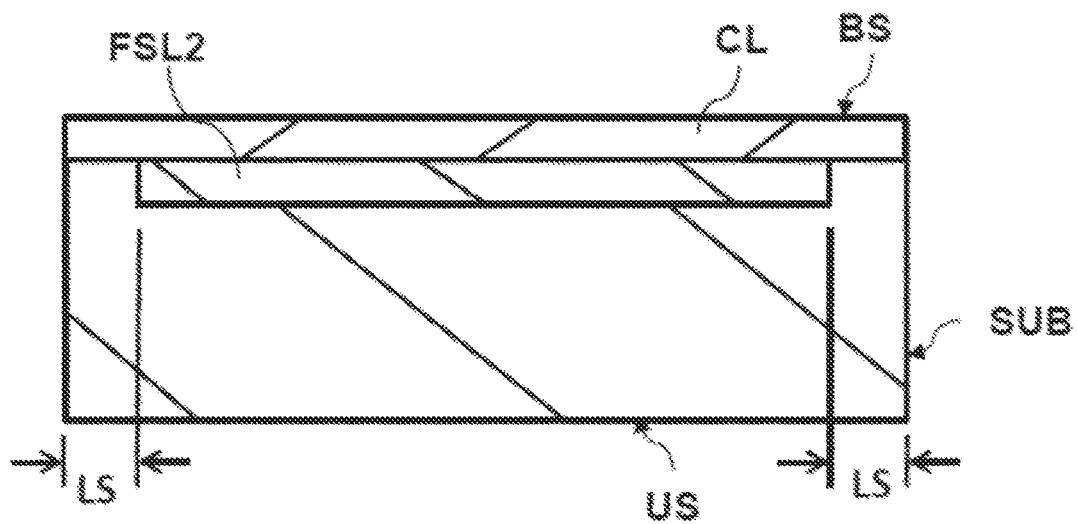
FIG. 19 is a cross-sectional view for describing the manufacturing method subsequent to FIG. 18.

Next, the manufacturing method of the IE-IGBT having the n-type field stop layer FSL2 will be described with reference to FIG. 16 to FIG. 19. FIG. 16 is a cross-sectional view for describing a manufacturing method on a back surface side of the semiconductor device having the IGBT. FIG. 17 is a cross-sectional view for describing the manufacturing method subsequent to FIG. 16. FIG. 18 is a cross-sectional view for describing the manufacturing method subsequent to FIG. 17. FIG. 19 is a cross-sectional view for describing the manufacturing method subsequent to FIG. 18. Also in this case, the description will be given while omitting the n-type emitter layer EL, the p-type base layer BL, the p-type base contact layer BC, the trench gate TG, the trench emitter TE, the p-type floating layer FL, the n-type hole barrier layer HBL, the interlayer insulating film IL, the gate electrode GE, the emitter electrode EE, the final passivation film FPF, and the like formed on the side of the front surface US of the substrate SUB.

As shown in FIG. 16, after the back grinding process, two resists RE are selectively formed on the back surface BS of the substrate SUB by the back-surface photolithography process using the double-sided aligner. The width of each resist RE is the predetermined distance LS. Next, in order to form the n-type field stop layer FSL2, an n-type impurity is introduced into the back surface BS of the substrate SUB by, for example, the ion implantation method using the resists RE as an ion implantation mask, thereby forming the n-type impurity implanted layer NI. The ion implantation conditions at this time are the same as those described in FIG. 12.

Next, as shown in FIG. 17, the resists RE are removed from the back surface BS of the substrate SUB. Then, in order to form the p-type collector layer CL, a p-type impurity is introduced into the entire back surface BS of the substrate SUB by, for example, the ion implantation method, thereby forming the p-type impurity implanted layer PI. The ion implantation conditions at this time are the same as those described in FIG. 13.

Thereafter, as shown in FIG. 18, laser annealing LA is performed on the back surface BS of the substrate SUB to activate the p-type impurity implanted layer PI and the n-type impurity implanted layer NI, thereby forming the p-type collector layer CL and the n-type field stop layer FSL2 as shown in FIG. 19.

Thereafter, though not shown, the collector electrode CE is formed on the surface of the p-type collector layer CL by the sputtering method. Then, the semiconductor device having the IGBT is formed by singulating the semiconductor wafer along the scribe line by the dicing process. Consequently, it is possible to form the IE-IGBT having the n-type field stop layer FSL2 as described in FIG. 6 and FIG. 7.

(Manufacturing Method of n-Type Field Stop Layer Using Stencil Mask)

Figure 20:
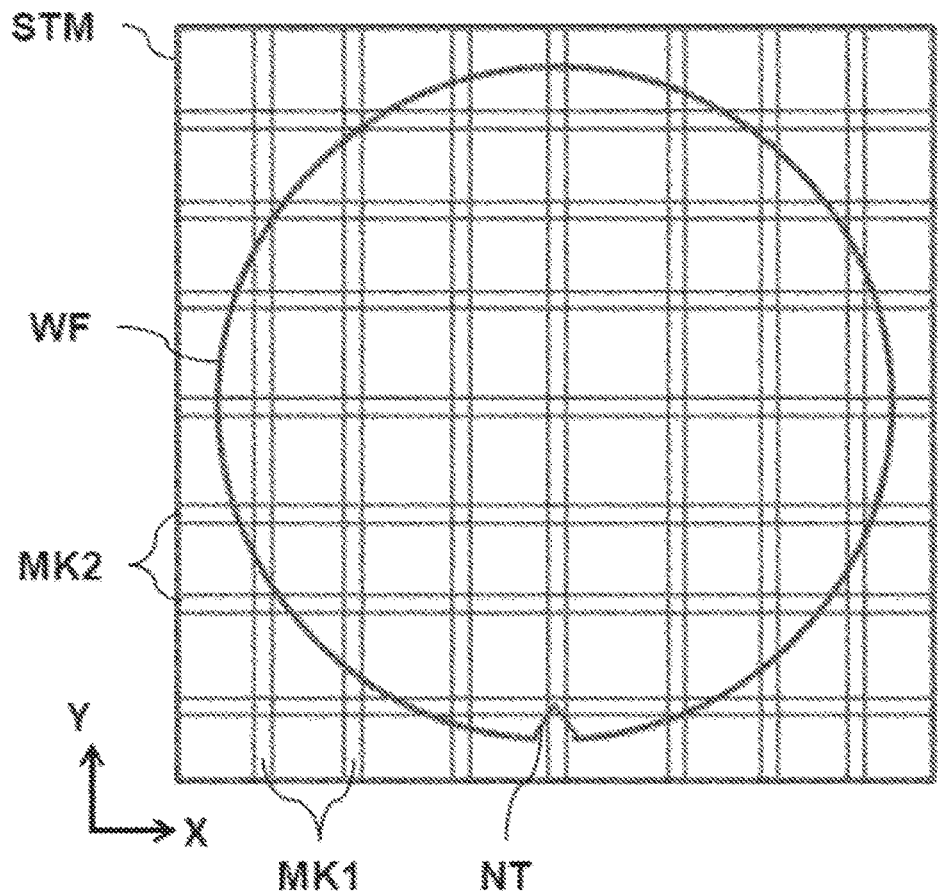
FIG. 20 is a plan view for describing a manufacturing method of an IGBT using a stencil mask according to one embodiment.
Figure 21:
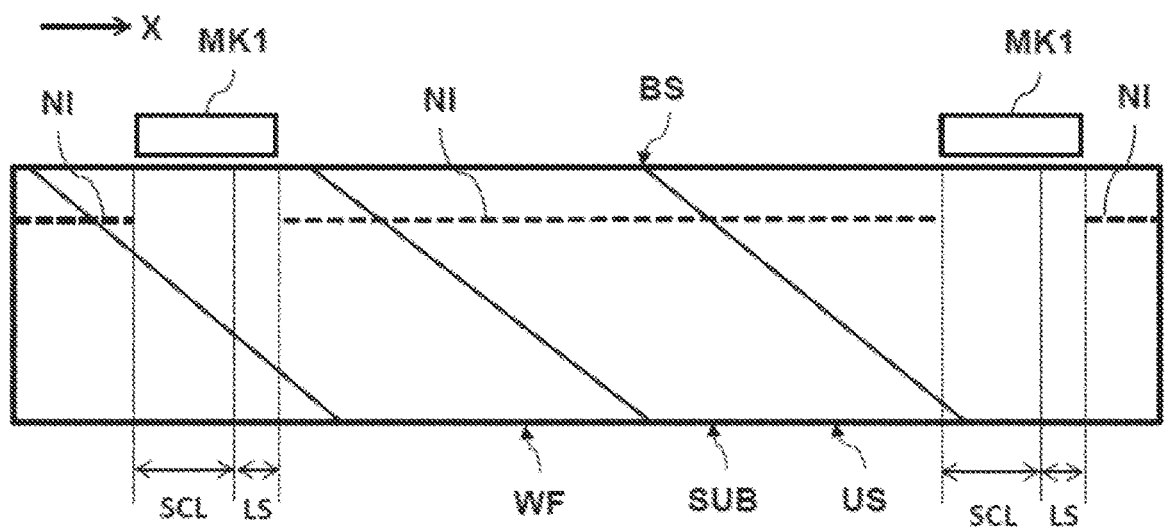
FIG. 21 is a cross-sectional view showing a principal part for describing a manufacturing method of an n-type field stop layer FSL1 using a stencil mask.
Figure 22:
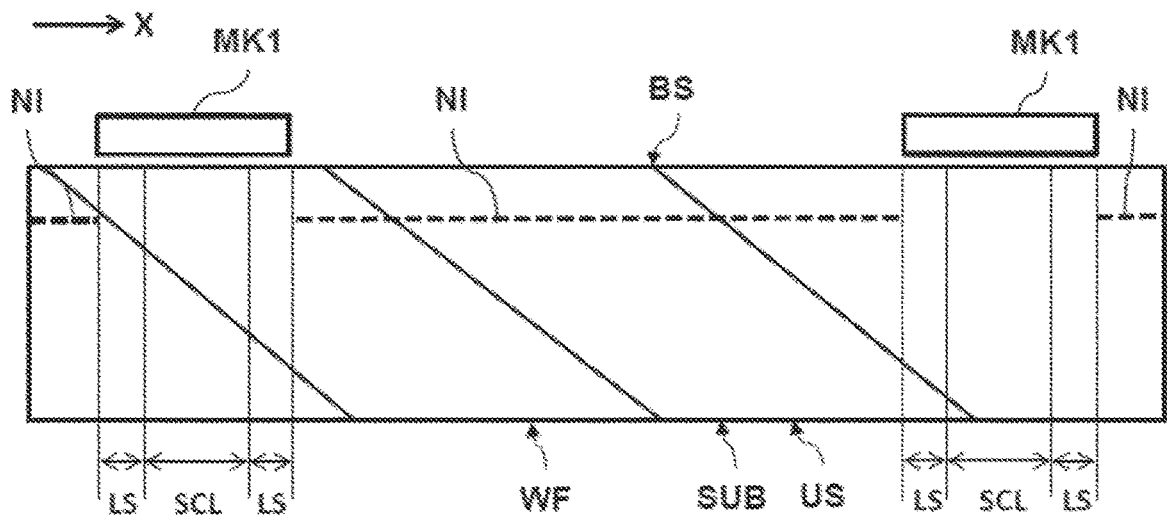
FIG. 22 is a cross-sectional view showing a principal part for describing a manufacturing method of an n-type field stop layer FSL2 using a stencil mask.

Next, a method of performing the ion implantation for forming the n-type field stop layers FSL1 and FSL2 with using a hard mask such as a stencil mask will be described. FIG. 20 is a plan view for describing a manufacturing method of an IGBT using a stencil mask. FIG. 21 is a cross-sectional view showing a principal part for describing a manufacturing method of the n-type field stop layer FSL1 using a stencil mask. FIG. 22 is a cross-sectional view showing a principal part for describing a manufacturing method of the n-type field stop layer FSL2 using a stencil mask. Also in the description of FIG. 21 and FIG. 22, the n-type emitter layer EL, the p-type base layer BL, the p-type base contact layer BC, the trench gate TG, the trench emitter TE, the p-type floating layer FL, the n-type hole barrier layer HBL, the interlayer insulating film IL, the gate electrode GE, the emitter electrode EE, the final passivation film FPF, and the like formed on the side of the front surface US of the substrate SUB are omitted.

As shown in FIG. 20, a stencil mask STM includes a plurality of first mask portions MK1 extending in the second direction Y and arranged in the first direction X and a plurality of second mask portions MK2 extending in the first direction X and arranged in the second direction Y. Regions surrounded by the first mask portions MK1 and the second mask portions MK2 are openings, and the ion implantation for forming the n-type field stop layers FSL1 and FSL2 is performed through these openings. The material of the stencil mask STM is desirably a material such as silicon Si or silicon carbide SiC in order to prevent the metal contamination.

In the state where the stencil mask STM is attached to the back surface of the semiconductor wafer (hereinafter, referred to also as a wafer) WF or floated at a certain distance, the ion implantation is performed through the stencil mask STM. By performing the ion implantation while floating the stencil mask STM from the back surface of the wafer WF at a certain distance, it is possible to prevent contamination of the wafer WF, adhesion of particles to the wafer WF, scratches on the wafer WF, and the like.

Since the width of the first mask portion MK1 in the first direction X and the width of the second mask portion MK2 in the second direction Y are as relatively large as 100 μm to 500 μm including the scribe lines between the semiconductor chips, the high alignment accuracy is not necessary and the stencil mask STM and the wafer WF can be aligned by using a wafer notch (NT) or an orientation flat (not shown). In this method, the double-sided aligner is not required. Also, since the back-surface photolithography process using the double-sided aligner can be eliminated, the manufacturing time (cycle time) of the semiconductor device can be shortened.

FIG. 21 shows the ion implantation process for forming the n-type field stop layer FSL1 after the back grinding process. In FIG. 21, the state of the ion implantation process for forming the n-type field stop layer FSL1 is shown in a cross-sectional view along the first direction X. In this case, the width of the first mask portion MK1 of the stencil mask STM in the first direction X is the width corresponding to the sum of the width of the scribe line SCL and the predetermined distance LS (SCL+LS). On the other hand, the width of the second mask portion MK2 of the stencil mask STM in the second direction Y is the width of the scribe line SCL. In this state, in order to form the n-type field stop layer FSL1, an n-type impurity is introduced into the back surface BS of the substrate SUB by, for example, the ion implantation method using the first mask portion MK1 and the second mask portion MK2 as an ion implantation mask. By this means, the n-type impurity implanted layer NI is formed. In this example, the ion implantation is performed in the state where the first mask portion MK1 and the second mask portion MK2 are floated from the back surface BS of the wafer WF by a certain distance. Thereafter, the stencil mask STM is removed and each process described in FIG. 13 to FIG. 15 is performed, so that the IE-IGBT 100 having the n-type field stop layer FSL1 is manufactured.

FIG. 22 shows the ion implantation process for forming the n-type field stop layer FSL2 after the back grinding process. In FIG. 22, the state of the ion implantation process for forming the n-type field stop layer FSL2 is shown in a cross-sectional view along the first direction X. In this case, the width of the first mask portion MK1 of the stencil mask STM in the first direction X and the width of the second mask portion MK2 of the stencil mask STM in the second direction Y are the widths corresponding to the sum of the predetermined distance LS, the width of the scribe line SCL, and the predetermined distance LS (LS+SCL+LS). In this state, in order to form the n-type field stop layer FSL2, an n-type impurity is introduced into the back surface BS of the substrate SUB by, for example, the ion implantation method using the first mask portion MK1 and the second mask portion MK2 as an ion implantation mask. By this means, the n-type impurity implanted layer NI is formed. Also in this example, the ion implantation is performed in the state where the first mask portion MK1 and the second mask portion MK2 are floated from the back surface BS of the wafer WF by a certain distance. Thereafter, the stencil mask STM is removed and each process described in FIG. 17 to FIG. 19 is performed, so that the IE-IGBT 100 having the n-type field stop layer FSL2 is manufactured.

(Manufacturing Method of n-Type Field Stop Layer Using Oxide Film)

Figure 23:
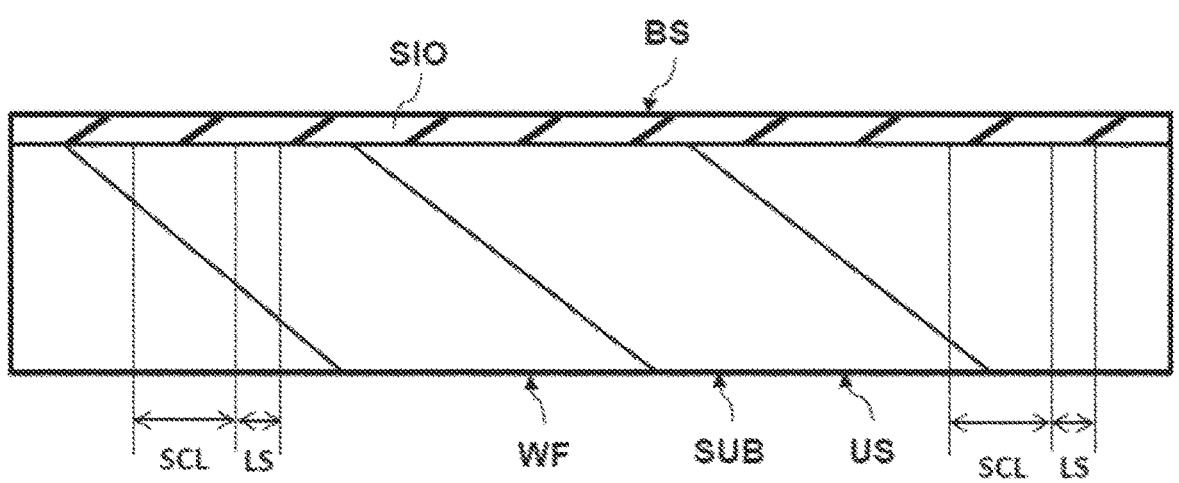
FIG. 23 is a cross-sectional view for describing a manufacturing method on a back surface side of the semiconductor device having the IGBT.
Figure 24:
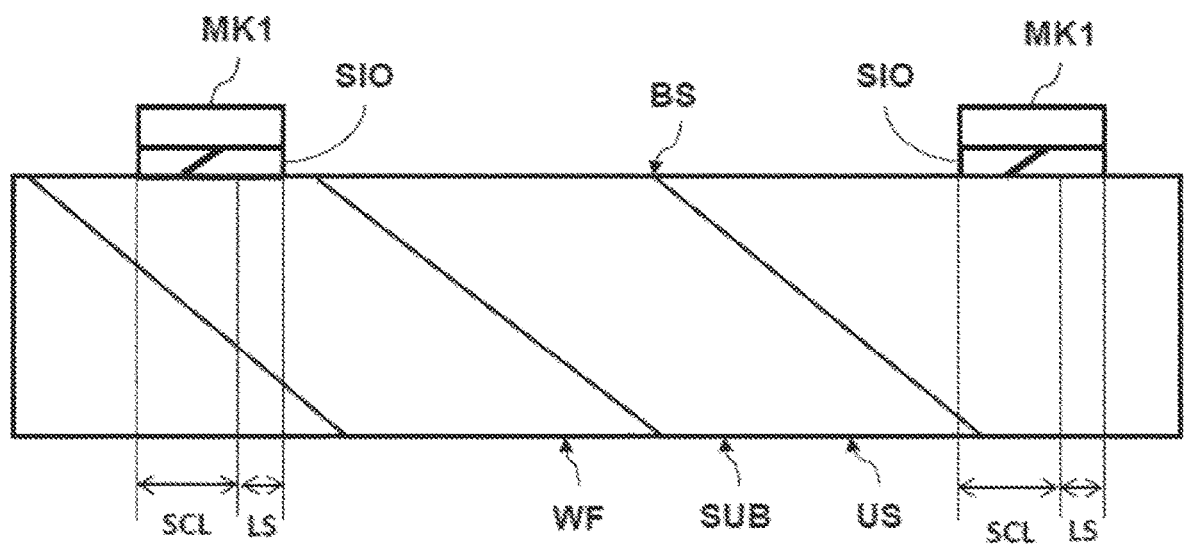
FIG. 24 is a cross-sectional view for describing the manufacturing method subsequent to FIG. 23.
Figure 25:
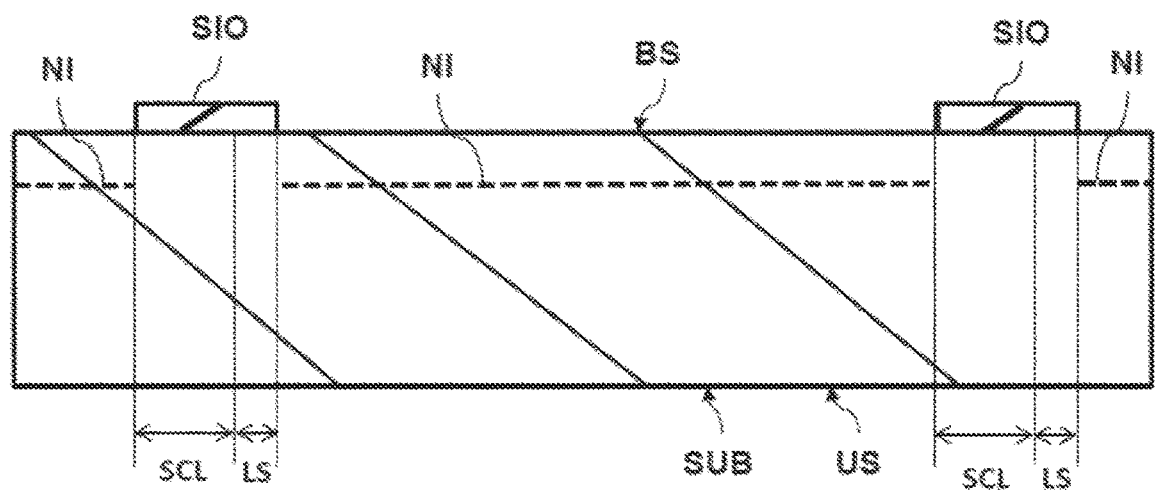
FIG. 25 is a cross-sectional view for describing the manufacturing method subsequent to FIG. 24.
Figure 26:
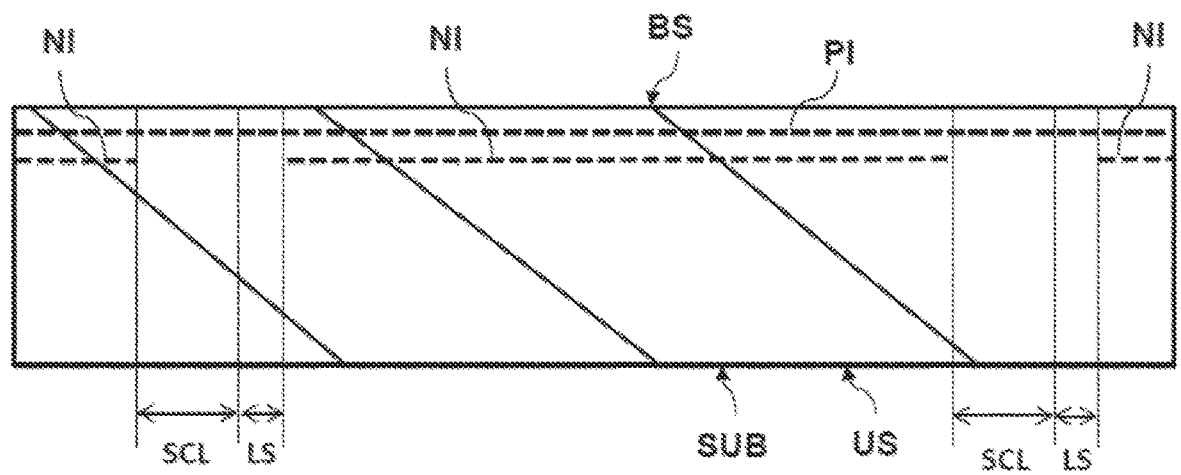
FIG. 26 is a cross-sectional view for describing the manufacturing method subsequent to FIG. 25.

Next, a method of performing the ion implantation for forming the n-type field stop layer FSL1 with using a hard mask such as an oxide film will be described. FIG. 23 is a cross-sectional view for describing a manufacturing method on the back surface side of the semiconductor device having the IGBT. FIG. 24 is a cross-sectional view for describing the manufacturing method subsequent to FIG. 23. FIG. 25 is a cross-sectional view for describing the manufacturing method subsequent to FIG. 24. FIG. 26 is a cross-sectional view for describing the manufacturing method subsequent to FIG. 25.

First, as shown in FIG. 2:3, after the back grinding process, a silicon oxide film SIC having a predetermined thickness is formed on the entire back surface BS of the substrate SUB. For example, the semiconductor wafer WF is placed in a reaction chamber of a sheet-fed low-temperature plasma CVD apparatus, and the silicon oxide film SIO is formed on the back surface of the semiconductor wafer WF at a low temperature such as 400° C. or lower.

Next, a part of the oxide film SIO corresponding to the ion implantation region for forming the n-type field stop layer FSL1 is removed by, for example, the wet etching method using the stencil mask STM described in FIG. 20. Therefore, as shown in FIG. 24, the first mask portion MK1 of the stencil mask STM is set so as to cover the oxide film SI, that is located on the scribe line SCL and the predetermined distance LS, and though not shown, the second mask portion MK2 of the stencil mask STM is set so as to cover the oxide film SIO that is located on the scribe line SCL. Then, the oxide film SIC in the region that is not covered with the first mask portion MK1 and the second mask portion MK2 is selectively removed by the wet etching method using the first mask portion MK1 and the second mask portion MK2 as an etching mask. The region that is not covered with the first mask portion MK1 and the second mask portion MK2 corresponds to the ion implantation region for forming the n-type field stop layer FSL1.

Next, as shown in FIG. 25, the stencil mask STM is removed from the back surface BS of the substrate SUB. Thereafter, in order to form the n-type field stop layer FSL1, an n-type impurity is introduced into the back surface BS of the substrate SUB by, for example, the ion implantation method using the oxide film SIO, which is no longer covered with the first mask portion MK1 and the second mask portion MK2, as an ion implantation mask. Consequently, the n-type impurity implanted layer NI is formed. The ion implantation conditions at this time are the same as those described in FIG. 12.

Next, as shown in FIG. 26, the oxide film SIO is removed from the back surface BS of the substrate SUB. Thereafter, in order to form the p-type collector layer CL, a p-type impurity is introduced into the entire back surface BS of the substrate SUB by, for example, the ion implantation method, thereby forming the p-type impurity implanted layer PI. The ion implantation conditions at this time are the same as those described in FIG. 13. Thereafter, each process described in FIG. 14 and FIG. 15 is performed, so that the IE-IGBT 100 having the n-type field stop layer FSL1 is manufactured. Those skilled in the art will naturally understand that the IE-IGBT 100 having the n-type field stop layer FSL2 can also be formed by performing the same process as that in FIG. 21 to FIG. 26.

The method of using the stencil mask STM as the etching mask can greatly improve the life of the stencil mask STM. In the method of using the stencil mask STM as an ion implantation mask described in FIG. 20 to FIG. 22, the life of the stencil mask STM may be relatively short due to the damage of the ion implantation. On the other hand, in the method of removing the oxide film by using the stencil mask STM as an etching mask, the stencil mask STM itself hardly wears, so that the life of the stencil mask STM can be relatively long, and one stencil mask STM can be used for a long time. Therefore, the cost of the semiconductor device 100 having the IGBT can be reduced.

(Modification)

Next, some modifications will be described.

(First Modification)

There are concerns described below regarding the n-type field stop layer FSL1 described in FIG. 3 and FIG. 4 and the n-type field stop layer FSL2 described in FIG. 6 and FIG. 7. At the time of the operation of the IGBT, the hole injection is likely to occur in the region where the n-type field stop layer FSL1 or the FSL2 is not formed. Namely, since the n-type field stop layer FSL1 or FSL2 having high impurity concentration is not present, the hole injection efficiency increases, and the hole concentration increases in the region near the first side surface SD1 of the semiconductor chip CHIP or the regions near the first to fourth side surfaces SD1 to SD4. If the IGBT is turned off in this state, the holes in the region near the first side surface SD1 or the regions near the first to fourth side surfaces SD1 to SD4 flow to the emitter electrode EE provided at the central portion of the chip through the plurality of annular p-type floating field rings P1 to P5. At this time, the Joule heat is generated. If the hole concentration in the region near the first side surface SD1 of the semiconductor chip CHIP or the regions near the first to fourth side surfaces SD1 to SD4 is high, heat is more likely to be generated, and there is a fear that the IGBT may be thermally broken.

Figure 27:
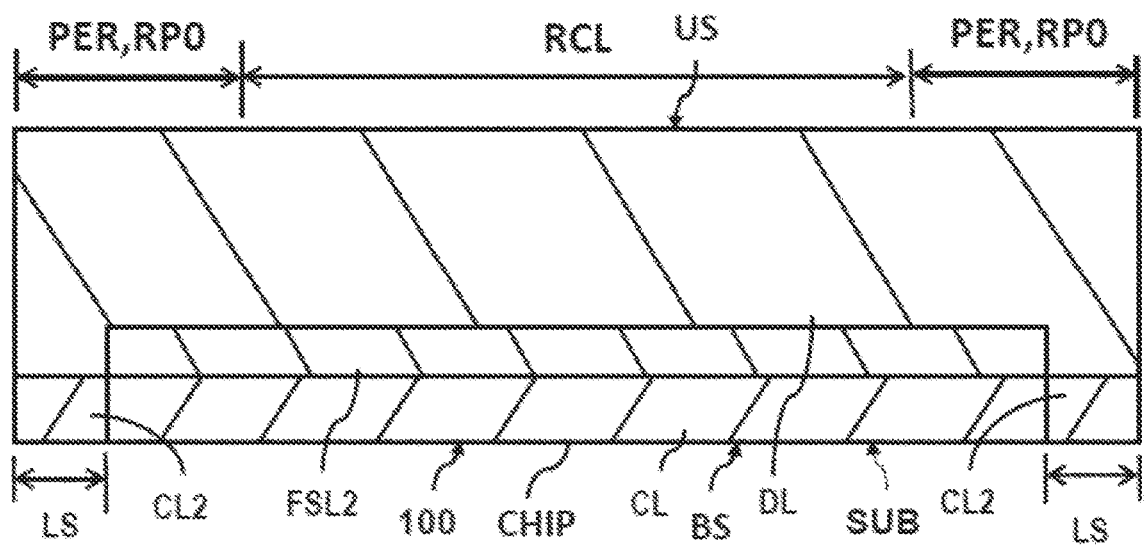
FIG. 27 is a cross-sectional view for describing a first structure example of a back surface of a semiconductor device according to a first modification.
Figure 28:
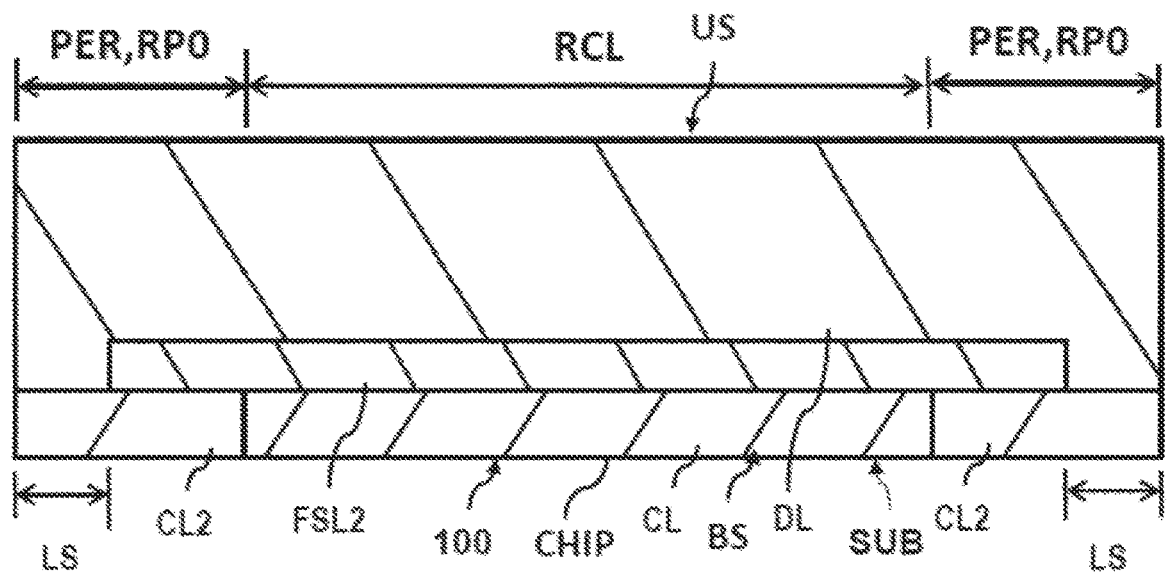
FIG. 28 is a cross-sectional view for describing a second structure example of the back surface of the semiconductor device according to the first modification.
Figure 29:
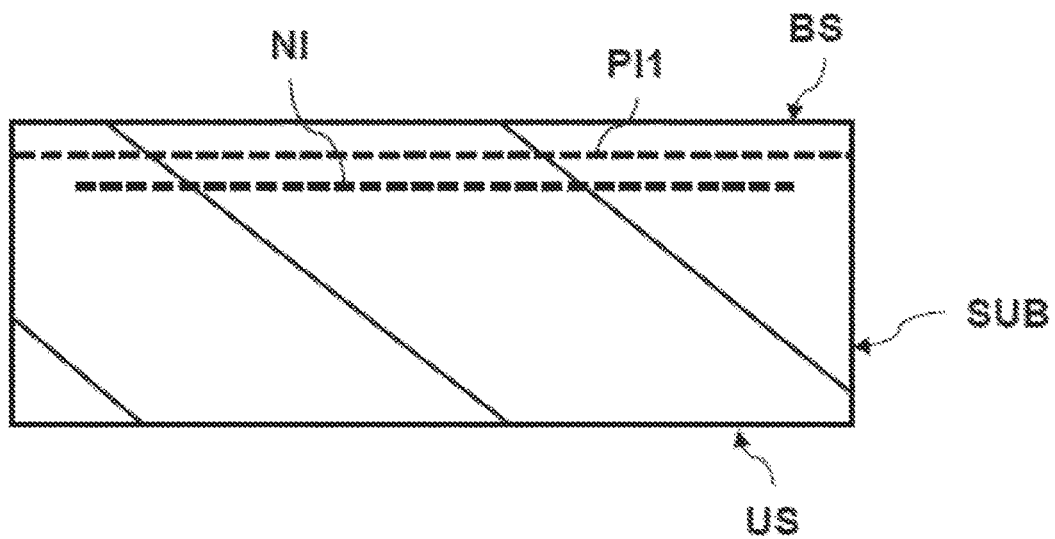
FIG. 29 is a cross-sectional view for describing a manufacturing method of the semiconductor device according to the first modification.
Figure 30:
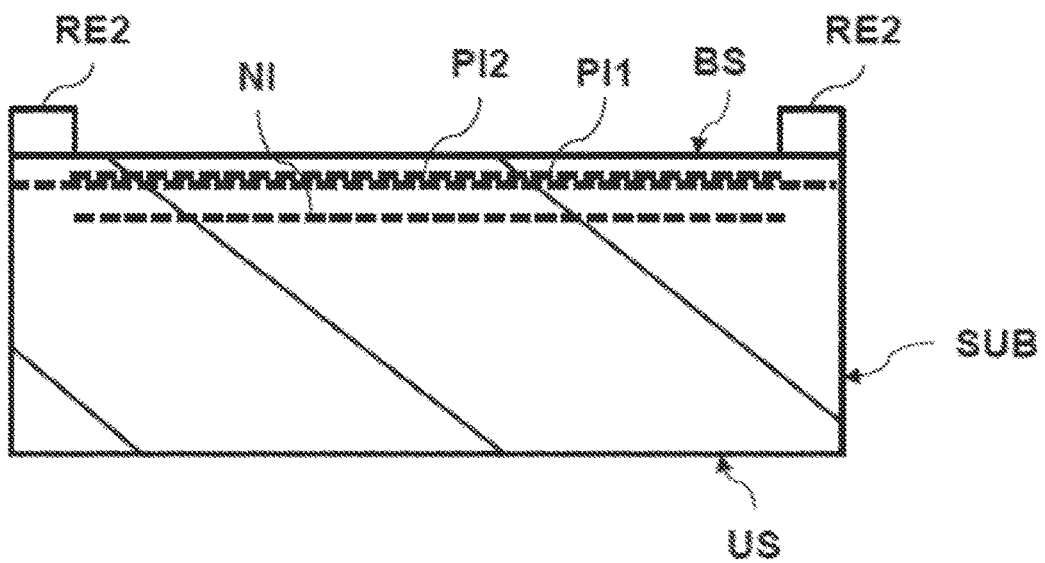
FIG. 30 is a cross-sectional view for describing the manufacturing method subsequent to FIG. 29.

The first modification is the configuration for solving the concern described above, and at least the p-type collector layer (CL2) provided on the back surface BS just below the region where the n-type field stop layer FSL1 or FSL2 is removed is formed to have an impurity concentration lower than that of the p-type collector layer (CL) provided in the region of the back surface BS below the cell formation region RCL. In the first modification, the semiconductor device having the n-type field stop layer FSL2 described in FIG. 5 and FIG. 7 will be described as a typical example. FIG. 27 is a cross-sectional view for describing a first structure example of a back surface of a semiconductor device according to the first modification. FIG. 28 is a cross-sectional view for describing a second structure example of the back surface of the semiconductor device according to the first modification. FIG. 29 is a cross-sectional view for describing a manufacturing method of the semiconductor device according to the first modification. FIG. 30 is a cross-sectional view for describing the manufacturing method subsequent to FIG. 29.

As shown in FIG. 27, in a first configuration example, the p-type collector layer CL is provided just below the n-type field stop layer FSL2 (or the region corresponding to the lower side thereof), and the p-type collector layer CL2 having an impurity concentration lower than that of the p-type collector layer CL is provided just below the region where the n-type field stop layer FSL2 is not present. If the p-type collector layer CL itself is eliminated in the IGBT, the body diode operates during the reverse bias as in the MOS, and it is thus indispensable to provide the p-type layer on the entire back surface BS of the substrate SUB. Those skilled in the art will naturally understand that the first configuration example can be applied also to the semiconductor device having the n-type field stop layer FSL1 described in FIG. 3 and FIG. 4.

As shown in FIG. 28, in a second configuration example, the p-type collector layer CL2 is provided not only just below the region where the n-type field stop layer FSL2 is not present but also the region of the back surface BS corresponding to the lower side of the chip outer peripheral region PER and the cell peripheral connection region RPG. In other words, the p-type collector layer CL is provided in the region of the back surface BS corresponding to the lower side of the cell formation region RCL, and the p-type collector layer CL2 having an impurity concentration lower than that of the p-type collector layer CL is provided in the other region of the back surface BS (region corresponding to the lower side of the chip outer peripheral region PER and the cell peripheral connection region RP0).

According to the first modification, since the p-type collector layer CL2 having an impurity concentration lower than that of the p-type collector layer CL is provided, the hole injection in the region near the first side surface SD1 of the semiconductor chip CHIP or the regions near the first to fourth side surfaces SD1 to SD4 is suppressed. Consequently, the thermal breakage of the IGBT when the IGBT is turned off can be suppressed.

(Manufacturing Method of First Configuration Example in First Modification)

Next, a manufacturing method of the first configuration example in the first modification shown in FIG. 27 will be described. FIG. 29 and FIG. 30 show the process performed instead of the process of the p-type impurity implanted layer PI described in FIG. 17.

After forming the n-type impurity implanted layer NI described in FIG. 16, the resist RE is removed from the back surface BS of the substrate SUB. Next, as shown in FIG. 29, in order to form the p-type collector layer CL2, a p-type impurity is introduced into the entire back surface BS of the substrate SUB by, for example, the ion implantation method, thereby forming a p-type impurity implanted layer PI1. As the ion implantation conditions at this time, for example, ionic species is boron, the dose amount is about $1\times10^{12}$ to $8\times10^{12}$ cm$^{-2}$, and the implantation energy is about 20 to 100 keV.

Next, as shown in FIG. 30, a resist RE2 is selectively formed on the back surface BS of the substrate SUB by the back-surface photolithography process. Note that the resist RE2 may be replaced with the stencil mask STM described in FIG. 20. Next, in order to form the p-type collector layer CL, a p-type impurity is introduced into the back surface BS of the substrate SUB by, for example, the ion implantation method using the resist RE2 as an ion implantation mask, thereby forming a p-type impurity implanted layer PI2. The p-type impurity implanted layer PI2 is selectively formed so as to be overlapped with the p-type impurity implanted layer PI1. The ion implantation conditions at this time may be the same as the ion implantation conditions when forming the p-type impurity implanted layer PI1. Alternatively, the does amount is about $1\times10^{13}$ to $3\times10^{13}$ cm$^{-2}$, and the implantation energy is about 20 to 100 keV. Boron is implanted again to the p-type impurity implanted layer PI1, so that the p-type impurity implanted layer PI1 and the p-type impurity implanted layer PI2 are formed so as to be overlapped with each other.

After the process of FIG. 30, the resist RE2 is removed from the back surface BS of the substrate SUB, and the laser annealing LA is performed to the back surface BS of the substrate SUB as shown in FIG. 18. Consequently, the p-type impurity implanted layers PI1 and PI2 and the n-type impurity implanted layer NI are activated, so that the p-type collector layers CL and CL2 and the n-type field stop layer FSL2 are formed as shown in FIG. 27. Thereafter, though not shown, the collector electrode CE is formed on the surfaces of the p-type collector layers CL and CL2 by the sputtering method. Then, the semiconductor device having the IGBT is formed by singulating the semiconductor wafer along the scribe line by the dicing process.

When forming the second configuration example in the first modification shown in FIG. 28, it is only necessary to form the p-type impurity implanted layer PI2 in the region corresponding to the cell formation region RCL by providing the resist RE2 shown in FIG. 30 in the region of the back surface BS corresponding to the chip outer peripheral region PER and the cell peripheral connection region RP0.

(Second Modification)

At the time of switching of the IGBT, for example, when the IGBT is used for an inductive load driving circuit, there is a concern that the collector-emitter voltage Vce momentarily exceeds the withstand voltage reference value. Further, in FIG. 21, FIG. 22, and FIG. 24, the case where the alignment accuracy of the wafer WF and the stencil mask STM is lowered due to the formation accuracy of the wafer notch NT and the like may be assumed. Due to these factors, there is a fear that the depletion layer DEL described in FIG. 5 extends to a region without the n-type field stop layer FSL1 or FSL2 and the punch-through occurs in the IGBT.

In the second modification, in a region where the n-type field stop layer FSL1 or FSL2 is not present in FIG. 4 and FIG. 7, an n-type field stop layer (FSL3) having an impurity concentration lower than those of the n-type field stop layers FSL1 and FSL2 is formed, thereby preventing the punch-through in the IGBT. Since the impurity concentration of the n-type field stop layer (FSL3) is low, the resistive component is large and the operation of the parasitic diode Ds during the reverse bias can be suppressed.

Figure 31:
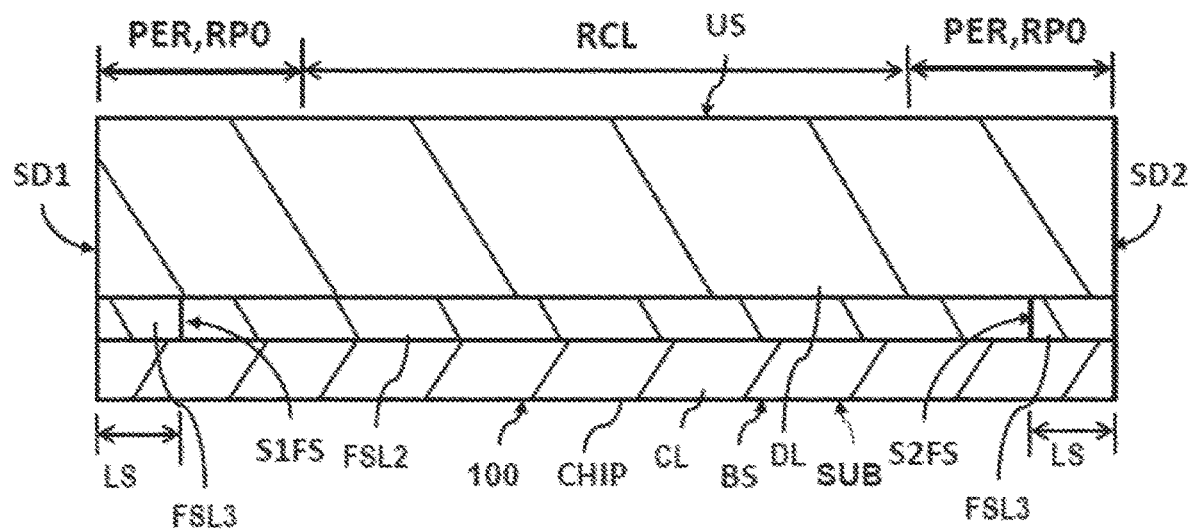
FIG. 31 is a cross-sectional view for describing a first structure example of a back surface of a semiconductor device according to a second modification.
Figure 32:
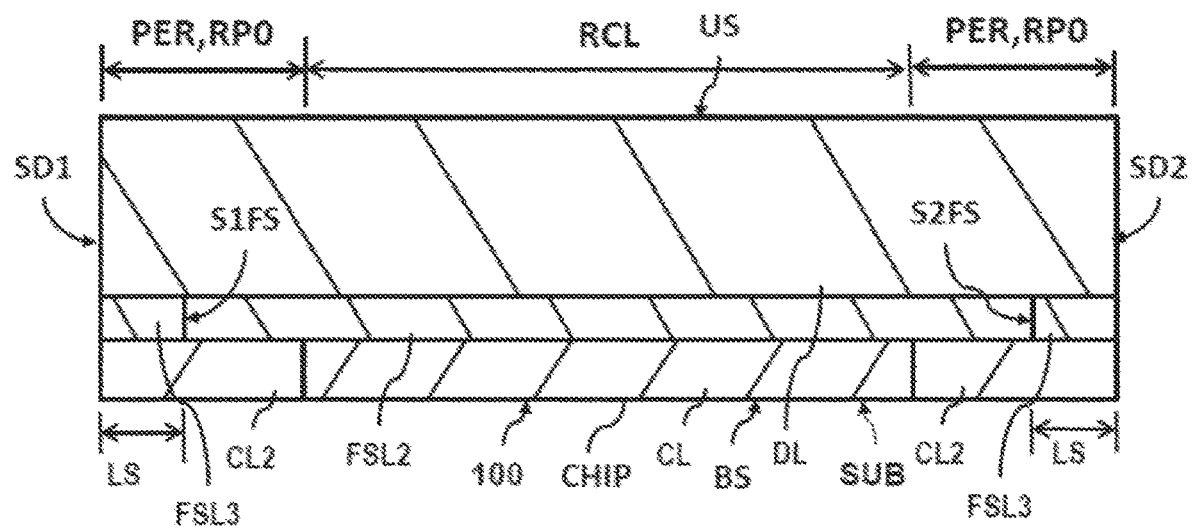
FIG. 32 is a cross-sectional view for describing a second structure example of the back surface of the semiconductor device according to the second modification.
Figure 33:
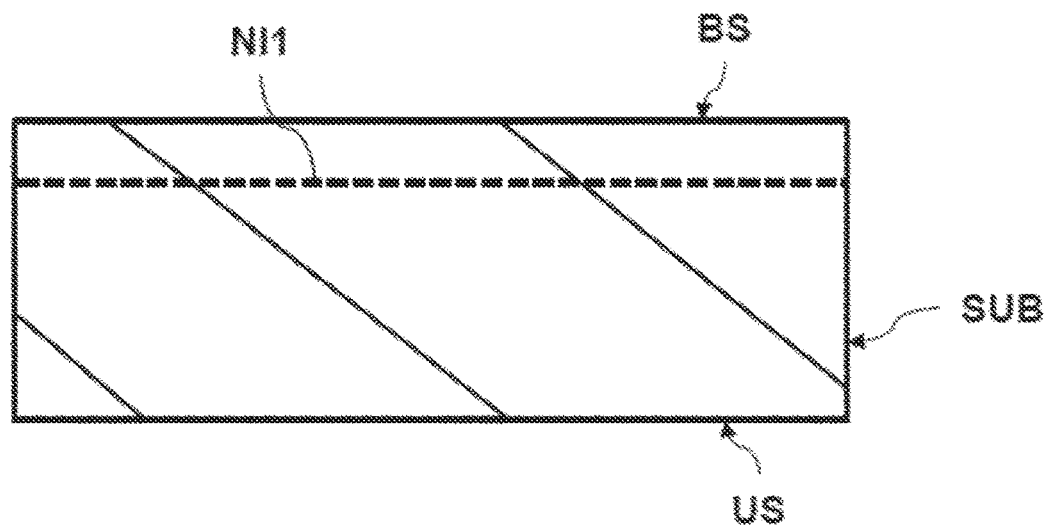
FIG. 33 is a cross-sectional view for describing a manufacturing method of the semiconductor device according to the second modification.
Figure 34:
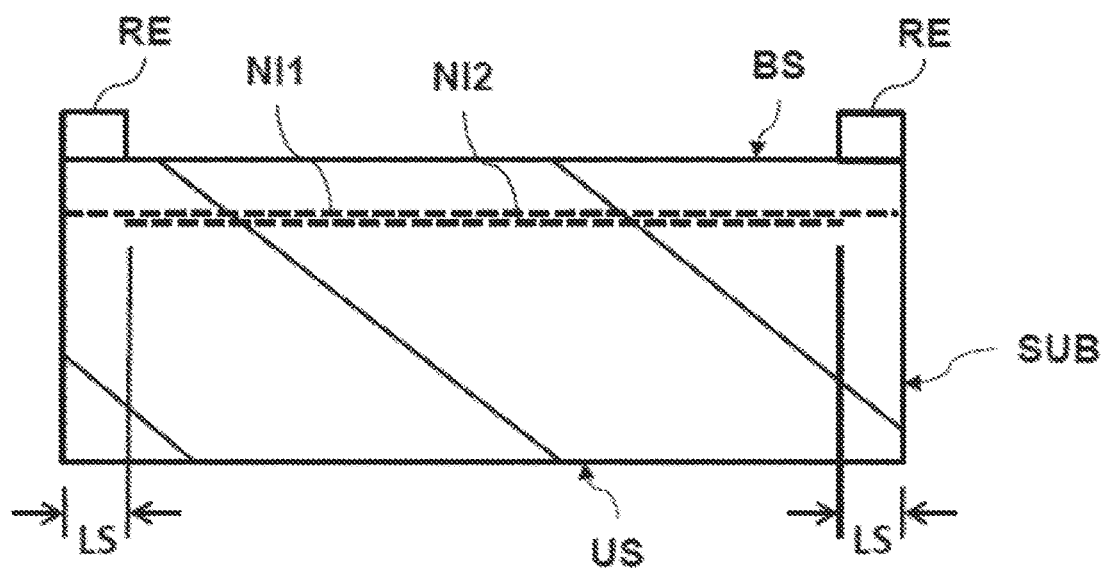
FIG. 34 is a cross-sectional view for describing the manufacturing method subsequent to FIG. 33.
Figure 35:
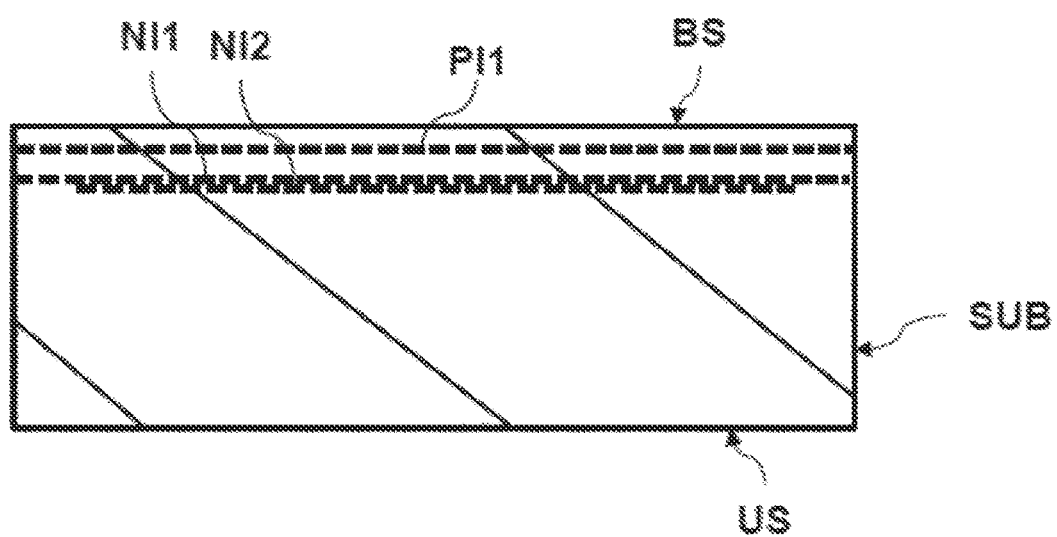
FIG. 35 is a cross-sectional view for describing the manufacturing method subsequent to FIG. 34.
Figure 36:
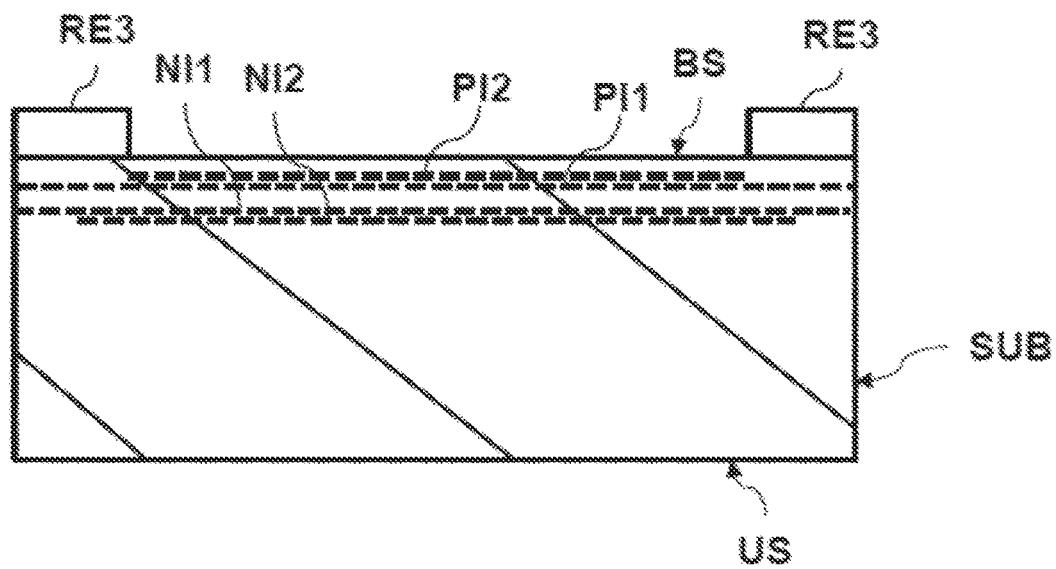
FIG. 36 is a cross-sectional view for describing the manufacturing method subsequent to FIG. 35.

FIG. 31 is a cross-sectional view for describing a first structure example of a back surface of a semiconductor device according to the second modification. FIG. 32 is a cross-sectional view for describing a second structure example of the back surface of the semiconductor device according to the second modification. FIG. 33 is a cross-sectional view for describing a manufacturing method of the semiconductor device according to the second modification. FIG. 34 is a cross-sectional view for describing the manufacturing method subsequent to FIG. 33. FIG. 35 is a cross-sectional view for describing the manufacturing method subsequent to FIG. 34. FIG. 36 is a cross-sectional view for describing the manufacturing method subsequent to FIG. 35. Also in FIG. 31 and FIG. 32, the description will be given while omitting the n-type emitter layer EL, the p-type base layer BL, the p-type base contact layer BC, the trench gate TG, the trench emitter TE, the p-type floating layer FL, the n-type hole barrier layer HBL, the interlayer insulating film IL, the emitter electrode EE, the final passivation film FPF, and the like formed on the side of the front surface US of the substrate SUB.

The point where FIG. 31 is different from FIG. 7 is that the n-type field stop layer FSL3 having an impurity concentration lower than that of the n-type field stop layer FSL2 is formed in the region where the n-type field stop layer FSL2 is not formed in FIG. 31. In other words, the n-type field stop layer FSL3 is formed between the first side surface SD1 of the semiconductor chip CHIP and the first end portion S1FS of the n-type field stop layer FSL2. Similarly, the n-type field stop layer FSL3 is formed between the second side surface SD2 of the semiconductor chip CHIP and the second end portion S2FS of the n-type field stop layer FSL2, between the third side surface SD3 of the semiconductor chip CHIP and the third end portion S3FS of the n-type field stop layer FSL2, and between the fourth side surface SD4 of the semiconductor chip CHIP and the fourth end portion S4FS of the n-type field stop layer FSL2. Consequently, the punch-through in the IGBT is prevented. In addition, the operation of the parasitic diode Ds during the reverse bias can be suppressed.

The point where FIG. 32 is different from FIG. 28 is that the n-type field stop layer FSL3 having an impurity concentration lower than that of the n-type field stop layer FSL2 is formed in the region where the n-type field stop layer FSL2 is not formed in FIG. 32. As in FIG. 31, the n-type field stop layer FSL3 is formed between the first side surface SD1 and the first end portion S1FS, between the second side surface SD2 and the second end portion S2FS, between the third side surface SD3 and the third end portion S3FS, and between the fourth side surface SD4 and the fourth end portion S4FS. Consequently, the thermal breakage of the IGBT can be suppressed. In addition, the punch-through in the IGBT can be prevented. Further, the operation of the parasitic diode Ds during the reverse bias can be suppressed.

(Manufacturing Method of Semiconductor Device Shown in FIG. 32)

Next, a manufacturing method of the semiconductor device shown in FIG. 32 will be described as a typical example.

As shown in FIG. 33, after the back grinding process, in order to form the n-type field stop layer FSL3, an n-type impurity is introduced into the back surface BS of the substrate SUB by, for example, the ion implantation method, thereby forming an n-type impurity implanted layer NI1. As the ion implantation conditions at this time, for example, ionic species is phosphorus P and the implantation energy is about 200 to 400 keV. The concentration of the layer NI1 (the layer FSL3) is about $1\times10^{15}$ to $1\times10^{17}$ $cm^{-3}$.

Next, as shown in FIG. 34, the resist RE is selectively formed on the back surface BS of the substrate SUB by the back-surface photolithography process using the double-sided aligner. The width of the resist RE is the predetermined distance LS. Next, in order to form the n-type field stop layer FSL2, an n-type impurity is introduced into the back surface BS of the substrate SUB by, for example, the ion implantation method using the resist RE as an ion implantation mask, thereby forming an n-type impurity implanted layer NI2. As the ion implantation conditions at this time, for example, ionic species is phosphorus P, the dose amount is about $5\times10^{12}$ to $1\times10^{13}$ $cm^{-2}$, and the implantation energy is about 200 to 400 keV.

Next, as shown in FIG. 35, the resist RE is removed from the back surface BS of the substrate SUB. Then, in order to form the p-type collector layer CL, a p-type impurity is introduced into the entire back surface BS of the substrate SUB by, for example, the ion implantation method, thereby forming the p-type impurity implanted layer PI1. As the ion implantation conditions at this time, for example, ionic species is boron, the dose amount is about $1\times10^{12}$ to $8\times10^{12}$ $cm^{-2}$, and the implantation energy is about 20 to 100 keV.

Next, as shown in FIG. 36, a resist RE3 is selectively formed on the back surface BS of the substrate SUB by the back-surface photolithography process. Note that the resist RE3 may be replaced with the stencil mask STM described in FIG. 20. Next, in order to form the p-type collector layer CL, a p-type impurity is introduced into the back surface BS of the substrate SUB by, for example, the ion implantation method using the resist RE3 as an ion implantation mask, thereby forming the p-type impurity implanted layer PI2. The p-type impurity implanted layer PI2 is selectively formed so as to be overlapped with the p-type impurity implanted layer PI1. The ion implantation conditions at this time may be the same as the ion implantation conditions when forming the p-type impurity implanted layer PI1. Alternatively, the does amount is about $1\times10^{13}$ to $3\times10^{13}$ $cm^{-2}$, and the implantation energy is about 20 to 100 keV. Boron is implanted again to the p-type impurity implanted layer PI1, so that the p-type impurity implanted layer PI1 and the p-type impurity implanted layer PI2 are formed so as to be overlapped with each other.

After the process of FIG. 36, the resist RE3 is removed from the back surface BS of the substrate SUB, and the laser annealing LA is performed to the back surface BS of the substrate SUB as shown in FIG. 18. Consequently, the p-type impurity implanted layers PI1 and PI2 and the n-type impurity implanted layer NI are activated, so that the p-type collector layers CL and CL2 and the n-type field stop layers FSL2 and FSL3 are formed as shown in FIG. 32. Thereafter, though not shown, the collector electrode CE is formed on the surfaces of the p-type collector layers CL and CL2 by the sputtering method. Then, the semiconductor device having the IGBT is formed by cutting and singulating the semiconductor wafer WF along the scribe line SCL by the dicing process.

Note that, by performing the laser annealing LA after the process of FIG. 35, the semiconductor device shown in FIG. 31 can be manufactured. In this case, those skilled in the art will easily understand that the ion implantation conditions of the p-type impurity implanted layer PI1 are changed to the ion implantation conditions of the p-type impurity implanted layer PI for forming the p-type collector layer CL.

(Description of Studies by Inventors)

Next, the studies by the inventors will be described.

(Reverse Bias Leakage)

Figure 37:
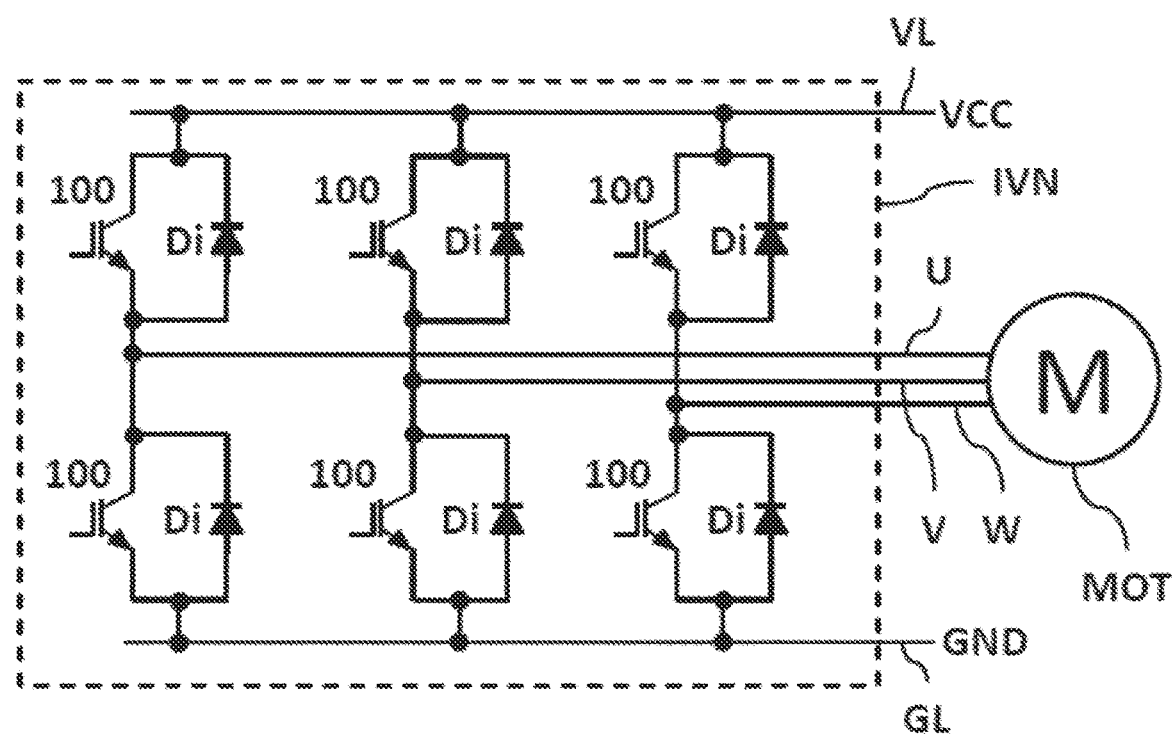
FIG. 37 is a circuit block diagram showing an example of a motor driving circuit.
Figure 38:
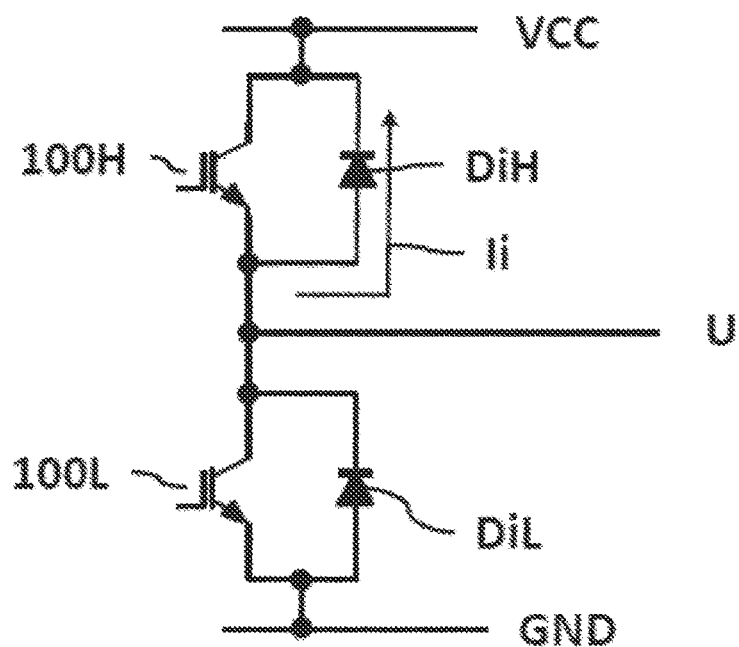
FIG. 38 is a circuit diagram for describing an operation of an IGBT and a diode corresponding to a U-phase in FIG. 37.
Figure 39:
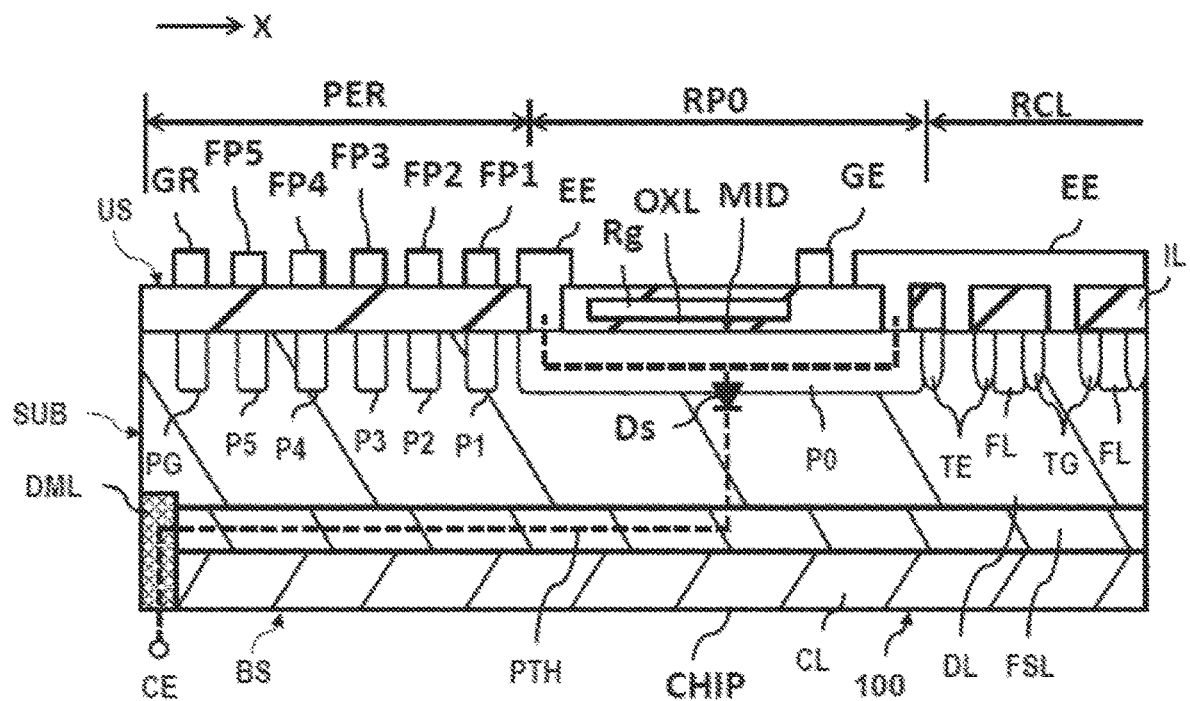
FIG. 39 is a cross-sectional view for describing a parasitic diode formed in an IGBT.
Figure 40:
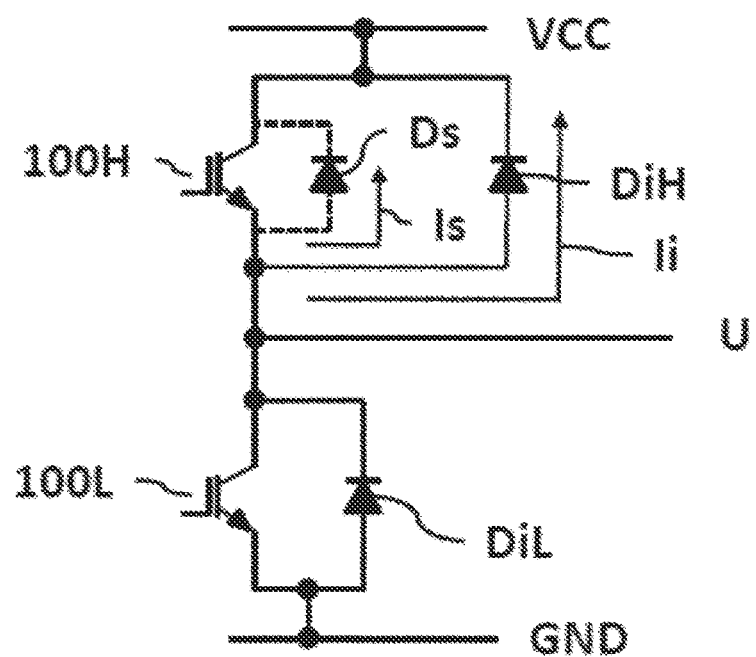
FIG. 40 is an equivalent circuit diagram for describing a parasitic diode formed in an IGBT on a high-side in FIG. 38.

FIG. 37 is a circuit block diagram showing an example of a motor driving circuit. FIG. 38 is a circuit diagram for describing an operation of an IGBT and a diode corresponding to a U-phase in FIG. 37. FIG. 39 is a cross-sectional view for describing a parasitic diode formed in an IGBT. FIG. 40 is an equivalent circuit diagram for describing a parasitic diode formed in an IGBT on a high-side in FIG. 38.

As shown in FIG. 37, the motor driving circuit includes a load such as a motor MOT and an inverter INV. The motor MOT is a three-phase motor having a U-phase U, a V-phase V, and a W-phase W. Therefore, the inverter INV is also configured to correspond to the three phases of the U-phase U, the V-phase V, and the W-phase W. The inverter INV corresponding to the three phases include a total of six pairs of the IGBT 100 and a freewheeling diode Di. In each of the three phases including the U-phase U, the V-phase V, and the W-phase W, the IGBT 100 and the freewheeling diode Di are connected in antiparallel to each other between a power supply wiring VCL that supplies the power supply potential (VCC) to the inverter INV and an input potential of the motor MOT (corresponding to an output terminal of the inverter INV), that is, on the high-side. Further, in each of the three phases including the U-phase U, the V-phase V, and the W-phase W, the IGBT 100 and the freewheeling diode Di are connected in antiparallel to each other between the input potential of the motor MOT (corresponding to the output terminal of the inverter INV) and a ground wiring GNL that supplies the ground potential (GND) to the inverter INV, that is, on the low-side. Here, antiparallel is a connection configuration in which the collector of the IGBT 100 is connected to the cathode of the freewheeling diode Di and the emitter of the IGBT 100 is connected to the anode of the freewheeling diode Di.

A SiC-SBD (Silicon carbide-Schottky Barrier Diode) can be used as each of the freewheeling diodes Di. In recent years, a hybrid module composed of a SiC-SBD and a Si-IGBT becomes more and more common. Since the SiC-SBD is unipolar, the reverse recovery time trr is shortened. Therefore, the Vce surge of the IGBT tends to be steeper, and the breakage of the IGBT due to the reverse bias leakage is likely to occur. This is because, although the details are described below, dV/dt becomes steep and impact ionization is likely to occur in the IGBT 100 on the high-side. Not to mention the ices defect of the IGBT, the damage layer DML at the time of dicing that increases the reverse bias leakage is becoming a situation that cannot be overlooked.

The inverter INV is provided with a dead time in order to prevent a load short-circuit of the upper and lower IGBTs of each phase, and the upper and lower IGBTs are turned off during the dead time period.

As shown in FIG. 38, during this dead time period, the current Ii does not flow through the IGBT 100H on the upper side (high-side), but flows through the freewheeling diode DiH on the high-side. When paying attention to the IGBT 100H on the upper side (high-side), since the freewheeling diode DiH operates, the IGBT 100H is brought into the reverse bias state in which the voltage on the emitter side of the IGBT 100H is higher than that of the collector. The reverse bias voltage (−VCE) is usually about −2 to −3 V.

When the IGBT 100L on the lower side (low-side) is turned on from the dead time state, the collector voltage of the IGBT 100L (=the emitter voltage of the IGBT 100H) falls to the operating voltage. Namely, the IGBT 100H is switched from the reverse bias state to the forward bias state. It has been found that, if the collector-emitter potential VCE of the IGBT 100H rapidly rises at dV/dt: 10 to 40 kV/µs at this time, the IGBT 100H may be broken. Usually, the IGBT operates with the collector-emitter potential VCE at about dV/dt: 2 to 7 kV/µs in many cases.

Since the IGBT 100 has the p-type collector layer CL on the side of the back surface BS of the substrate SUB, the body diode is not present unlike the MOSFET. However, it has been found that, if the PN junction composed of the n-type field stop layer FSL and the p-type collector layer CL on the side of the back surface BS of the substrate SUB is short-circuited by the damage layer DML at the time of the dicing process as shown in FIG. 39, the parasitic diode Ds operates during the reverse bias. This parasitic diode Ds is composed of the PN junction of the annular p-type well region P0 and the n-type drift layer DL located below the forming portion of the built-in gate resistance Rg. The anode of the parasitic diode Ds is connected to the emitter electrodes EE connected on the left and right sides of the p-type well region P0. Since the concentration of the n-type field stop layer FSL is higher than that of the n-type drift layer DL, the cathode of the parasitic diode Ds is connected to the collector electrode CE from the n-type drift layer DL below the p-type well region P0 via the n-type field stop layer FSL. Consequently, the current path (leakage path) PTH including the parasitic diode Ds is formed between the emitter electrodes EE and the collector electrode CE.

As shown in FIG. 40, the parasitic diode Ds is configured to be connected between the emitter and the collector of the IGBT 100H. When paying attention to the IGBT 100H, since the current Ii flows through the freewheeling diode Di during the dead time period, the emitter voltage of the IGBT 100H is higher than the collector voltage thereof (reverse bias state). When the leakage path PH is present at the PN junction portion on the back surface of the IGBT 100H, the parasitic diode Ds operates, so that the current Is flows also through the parasitic diode Ds of the IGBT 100H.

When the IGBT 100L on the low-side is turned on in this state, the collector voltage of the IGBT 100L on the low-side, that is, the emitter voltage of the IGBT 100H on the high-side falls to the operating voltage of the IGBT 100L. For example, the emitter voltage of the IGBT 100H falls from the inverter driving voltage (VCC), for example, 800 V to about 2 V. At this time, when the IGBT 100L on the low-side is turned on at high dV/dt, the IGBT 100H on the high-side is broken. The mechanism of the breakage of the IGBT 100H on the high-side is as follows.

(1) Since the leakage path is present on the back surface side, the parasitic diode Ds of the IGBT 100H on the high-side operates during the dead time.

(2) When the IGBT 100L on the low-side is turned on, the collector-emitter potential Vce is applied to the IGBT 100H on the high-side. Namely, the collector-emitter potential Vce of the IGBT 100H on the high-side switches from the reverse bias to the forward bias state (the gate voltage of the IGBT 100H on the high-side remains off).

(3) During the reverse bias, a large number of carriers are present in the bulk due to the operation of the parasitic diode Ds.

(4) When the collector-emitter potential Vce of the IGBT 100H on the high-side rises at high dV/dt in this state, the impact ionization easily occurs at the PN junction portion of the parasitic diode Ds.

(5) A large number of hole carriers generated by the impact ionization flow to the emitter electrode EE via the emitter contact through the p-type well region P0 located below the built-in resistance Rg.

(6) At this time, since the voltage drop occurs in the p-type well region P0, the high electric field is generated in the oxide film OXL between the p-type well region P0 and the built-in resistance Rg, and the oxide film OXL reaches the dielectric breakdown. Note that the description is given here by using the built-in resistance Rg, but is not limited to this. The same problem occurs when there is a pattern wide in the first direction X in the cell peripheral connection region RP0. Namely, the voltage drop is large when there is the pattern wide in the first direction X, and this causes the dielectric breakdown or the decrease in the life of the oxide film.

The portion where the dielectric breakdown of the oxide film OXL occurs is around an intermediate portion MID between the emitter contact portions of the emitter electrodes EE connected to left and right sides of the p-type well region P0. In FIG. 39, the width of the cell peripheral connection region RP0 in the first direction X, that is, the width of the p-type well region P0 in the first direction X is, for example, about 1 to 4 mm, and the width of the outer peripheral portion PER in the first direction X is, for example, about 400 to 600 µm. Namely, since the width of the p-type well region PC in the first direction X is relatively long and the interval between the emitter contact portions of the emitter electrodes EE is wide, the voltage drop due to the p-type well region PC is relatively large. Consequently, a high electric field is generated in the oxide film OXL. This high electric field causes a factor of significantly decreasing the life of the oxide film OXL even though it does not lead to the dielectric breakdown of the oxide film OXL.

For solving these problems, it is important to have the configuration that prevents the parasitic diode Ds from operating. Therefore, as described in FIG. 5, it is preferable to prevent the potential between the anode and the cathode of the parasitic diode Ds from reaching the potential equal to or higher than the threshold value of the parasitic diode Ds by inserting the parasitic resistance Rs in the leakage path PTH1 extending from the collector electrode CE to the cathode of the parasitic diode Ds. In FIG. 5, the value of the parasitic resistance Rs depends on the predetermined distance LS, that is, the width (length) of the n-type drift layer DL in the first direction X located between the first side surface SD1 of the semiconductor chip CHIP and the first end portion S1FS of the n-type field stop layer FSL1.

(Distance LS)

Figure 41:
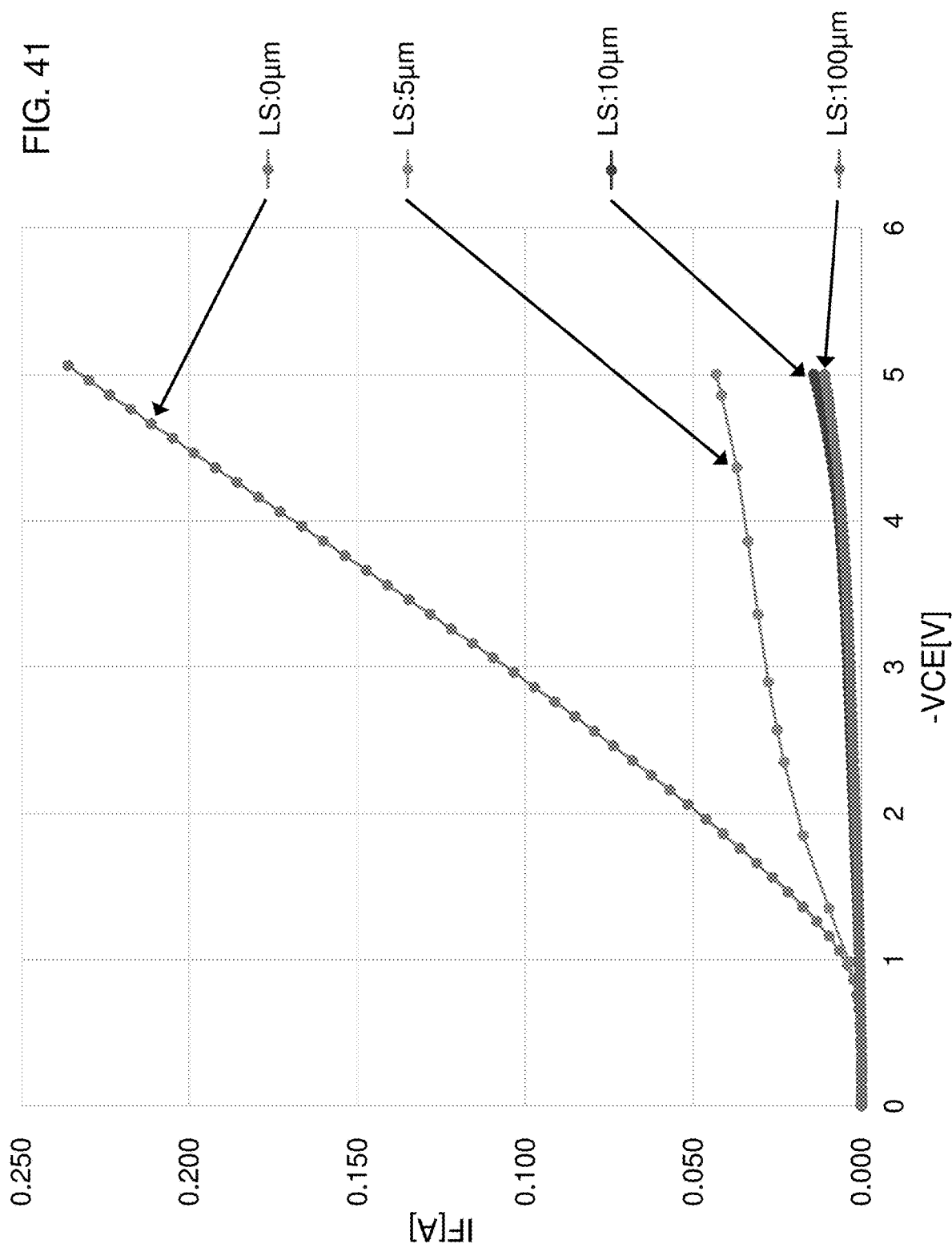
FIG. 41 is a graph showing characteristics of a parasitic diode during reverse bias when a distance LS is varied.

Next, the predetermined distance LS will be described. FIG. 41 is a graph showing characteristics of the parasitic diode during reverse bias when the distance LS is varied in the state where the PN junction composed of the p-type collector layer CL and the n-type field stop layer FSL is short-circuited on the dicing surface. The horizontal axis represents the collector-emitter voltage (−VCE: voltage between the anode and cathode of the parasitic diode), and the vertical axis represents the current (IF) flowing through the parasitic diode. The distance LS is varied to 0 µm, 5 µm, 10 µm, and 100 µm.

In the case where the distance LS is 0 µm, the parasitic diode operates. This state corresponds to the state shown in FIG. 2.

In the case where the distance LS is 5 µm, 10 µm, and 100 µm, as can be seen from FIG. 41, the operation of the parasitic diode Ds can be significantly suppressed when the distance LS between the dicing surface (for example, the first side surface SD1) and the first end portion S1FS of the n-type field stop layer FSL1 or FSL2 is set to 10 µm or more.

In the normal dicing, the chipping of about 20 µm is formed in the lateral direction on the dicing surface. Therefore, in order to suppress the operation of the parasitic diode Ds, the distance LS is desirably set to 30 µm (=20 µm+10 µm) or more. On the other hand, during the forward bias, since a depletion layer DEL spreads as indicated by the fine dotted line in FIG. 5, it is also possible to separate the first end portion S1FS (second end portion S2FS, third end portion S3FS, fourth end portion S4SF) of the n-type field stop layer FSL1 or FSL2 from the first side surface SD1 (second side surface SD2, third side surface SD3, fourth side surface SD4) of the semiconductor chip CHIP by about 200 to 300 µm. Therefore, it is preferable that the value of the predetermined distance LS is set to about 30 to 300 µm, more preferably about 30 to 200 µm.

(Electric Field Generated in Oxide Film)

Figure 42:
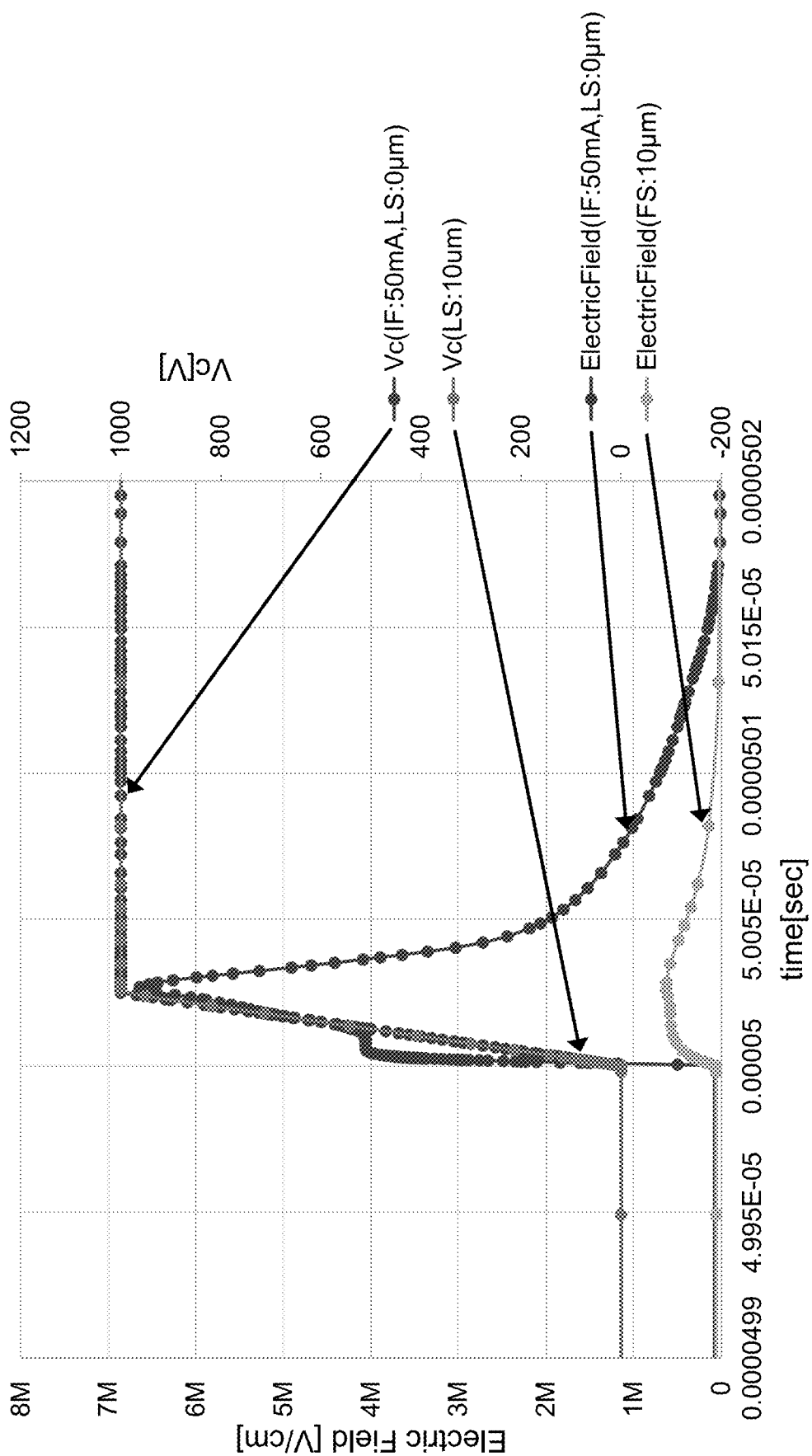
FIG. 42 is a graph showing a switching waveform when a collector potential is applied at high speed from a reverse bias state to a forward bias state.

Next, the electric field generated in the intermediate portion MID of the oxide film OXL will be described. FIG. 42 is a graph showing a switching waveform when a collector potential is applied at high speed from a reverse bias state to a forward bias state. The left vertical axis represents the electric field generated in the intermediate portion MID of the oxide film OXL, the right vertical axis represents the collector potential Vc, and the horizontal axis represents the time. In each of the cases where the distance LS is 0 µm and the distance LS is 10 µm, the electric field generated in the intermediate portion MID of the oxide film OXL when the collector potential Vc is changed from the reverse bias state (Vc=−2 V) to the forward bias state (Vc=1000 V) at dV/dt=40 kV/µsec is shown.

In the configuration example in which the distance LS is 0 µm, for example, in the case where the current of 50 mA flows through the parasitic diode Ds, the electric field of 7 MV/cm is generated in the oxide film OXL as indicated by the electric field (IF=50 mA, LS=0 µm), and there is a large risk of the dielectric breakdown of the oxide film OXL.

In the configuration example in which the distance LS is 10 µm, the parasitic diode Ds does not operate, and thus the electric field as small as about 0.5 MV/cm is just generated in the oxide film OXL as indicated by the electric field (LS=10 µm). It can be understood that the risk of the dielectric breakdown of the oxide film OXL is eliminated and the life of the oxide film OXL is not affected.

Therefore, since the operation of the parasitic diode Ds can be suppressed, the IGBT 100 having the n-type field stop layer FSL1 or FSL2 described in the first embodiment (FIG. 3, FIG. 4) and the second embodiment (FIG. 6, FIG. 7) can suppress the occurrence of the leakage defect during the reverse bias. Also, since the high electric field is not generated in the oxide film below the built-in resistance Rg even when the IGBT 100 is operated at high speed, the risk of the dielectric breakdown of the oxide film can be reduced, and the life of the oxide film below the built-in resistance Rg is not affected. Accordingly, it is possible to provide the highly robust IGBT capable of high-speed switching operation.

In the foregoing, the invention made by the inventors has been specifically described based the embodiments, but it goes without saying that the present invention is not limited to the embodiments and the examples described above and can be variously modified.

For example, the semiconductor substrate (silicon substrate) SUB may be a substrate in which an n-type epitaxial layer with a low impurity concentration is formed on an n-type semiconductor substrate with a high impurity concentration.

What is claimed is:

1. A semiconductor device comprising:
    a silicon substrate having a first main surface and a second main surface opposite the first main surface;
    p-type base layers formed in the first main surface;
    an n-type emitter layer formed in one of the p-type base layers;
    n-type hole barrier layers formed in the first main surface and formed below the p-type base layers;
    a p-type collector layer formed on the second main surface;
    an n-type field stop layer formed on the second main surface and formed on an inner side of the p-type collector layer; and an n-type drift layer arranged between the n-type field stop layer and the n-type hole barrier layers, wherein the silicon substrate has a first side surface in a plan view, wherein the n-type field stop layer has a first end portion facing the first side surface of the silicon substrate, wherein the n-type field stop layer is selectively provided on an upper side of the p-type collector layer such that the first end portion of the n-type field stop layer is separated from the first side surface of the silicon substrate by a predetermined distance, wherein the n-type drift layer is provided between the first side surface of the silicon substrate and the first end portion of the n-type field stop layer, wherein the p-type collector layer includes a first p-type collector layer located below the n-type field stop layer and a second p-type collector layer located below the n-type drift layer, wherein an impurity concentration of the second p-type collector layer is lower than an impurity concentration of the first p-type collector layer, and wherein a boundary of the first p-type collector layer and the second p-type collector layer is in a chip outer peripheral region outside a cell formation region including the p-type base layers.

2. The semiconductor device according to claim 1, further comprising:

stripe-shaped trench gates formed in the first main surface so as to face each other;

strip-shaped trench emitters formed in the first main surface, arranged at a predetermined interval from the stripe-shaped trench gates, and formed so as to face each other; and a p-type floating layer arranged between the trench gate and the trench emitter, wherein the p-type base layers are formed in the first main surface and formed in a region surrounded by the stripe-shaped trench gates.

3. The semiconductor device according to claim 1, wherein an impurity concentration of the n-type drift layer is lower than an impurity concentration of the n-type field stop layer.

4. The semiconductor device according to claim 3, wherein the predetermined distance is 30 to 200 µm.

5. The semiconductor device according to claim 4, wherein the silicon substrate further has a second side surface facing the first side surface, a third side surface provided between the first side surface and the second side surface, and a fourth side surface facing the third side surface, wherein the n-type field stop layer further has a second end portion facing the second side surface of the silicon substrate, a third end portion facing the third side surface of the silicon substrate, and a fourth end portion facing the fourth side surface of the silicon substrate, and wherein the second side surface and the second end portion are separated by the predetermined distance, the third side surface and the third end portion are separated by the predetermined distance, and the fourth side surface and the fourth end portion are separated by the predetermined distance, respectively.

6. The semiconductor device according to claim 1, wherein the silicon substrate includes, in addition to the cell formation region including the p-type base layers, (1) a cell peripheral connection region provided so as to surround the cell formation region and (2) an outer peripheral region provided so as to surround the cell peripheral connection region, wherein the cell formation region further includes an emitter electrode, and wherein the cell peripheral connection region between the first side surface and the first end portion includes:
   a gate resistance;
   an oxide film formed between the gate resistance and the first main surface of the silicon substrate; and
   a p-type well region formed below the oxide film and connected to the emitter electrode by a plurality of emitter contacts.

7. A semiconductor device comprising:

a silicon substrate having a first main surface and a second main surface facing the first main surface;

p-type base layers formed in the first main surface;

an n-type emitter layer formed in one of the p-type base layers;

n-type hole barrier layers formed in the first main surface and formed below the p-type base layers;

a p-type collector layer formed on the second main surface;

an n-type field stop layer formed on the second main surface and formed on an inner side of the p-type collector layer; and an n-type drift layer arranged between the n-type field stop layer and the n-type hole barrier layers, wherein the silicon substrate has a first side surface in a plan view, wherein the n-type field stop layer has a first end portion facing the first side surface of the silicon substrate, wherein the n-type field stop layer is selectively provided on an upper side of the p-type collector layer such that the first end portion of the n-type field stop layer is separated from the first side surface of the silicon substrate by a predetermined distance, wherein the n-type drift layer is provided between the first side surface of the silicon substrate and the first end portion of the n-type field stop layer, wherein the silicon substrate includes a cell formation region including the p-type base layers, a cell peripheral connection region provided so as to surround the cell formation region, and an outer peripheral region provided so as to surround the cell peripheral connection region, wherein the p-type collector layer includes a first p-type collector layer provided so as to correspond to a lower side of the cell formation region and a second p-type collector layer provided so as to correspond to lower sides of the cell peripheral connection region and the outer peripheral region, wherein an impurity concentration of the second p-type collector layer is lower than an impurity concentration of the first p-type collector layer, and wherein a boundary of the first p-type collector layer and the second p-type collector layer is in a chip outer peripheral region outside the cell formation region.

* * * * *